US008922466B2

(12) United States Patent
Asano

(10) Patent No.: US 8,922,466 B2
(45) Date of Patent: *Dec. 30, 2014

(54) DISPLAY PANEL DRIVING METHOD, DISPLAY APPARATUS, DISPLAY PANEL DRIVING APPARATUS AND ELECTRONIC APPARATUS

(75) Inventor: Mitsuru Asano, Kanagawa (JP)

(73) Assignee: Sony Corporation, Tokyo (JP)

( * ) Notice: Subject to any disclaimer, the term of this patent is extended or adjusted under 35 U.S.C. 154(b) by 1371 days.

This patent is subject to a terminal disclaimer.

(21) Appl. No.: 12/153,477

(22) Filed: May 20, 2008

(65) Prior Publication Data

US 2009/0033686 A1 Feb. 5, 2009

(30) Foreign Application Priority Data

Jun. 5, 2007 (JP) ................................ 2007-148699

(51) Int. Cl.
G09G 3/30 (2006.01)
G09G 3/20 (2006.01)
G09G 3/32 (2006.01)
H01L 27/32 (2006.01)

(52) U.S. Cl.
CPC ............ *G09G 3/2022* (2013.01); *G09G 3/3233* (2013.01); *G09G 2310/08* (2013.01); *G09G 2320/0247* (2013.01); *G09G 2320/0261* (2013.01); *H01L 27/3244* (2013.01)
USPC .............................................. 345/77; 345/76

(58) Field of Classification Search
CPC ............... G09G 3/30–3/3426; G09G 2310/02; G09G 2310/0202; G09G 2310/0213; G09G 2310/0243; G09G 2310/06

USPC ...................... 345/76–83, 100–102, 204–215
See application file for complete search history.

(56) References Cited

U.S. PATENT DOCUMENTS 6,661,180 B2 * 12/2003 Koyama ..................... 315/169.3
6,909,409 B2 * 6/2005 Tanada ............................ 345/51

(Continued)

FOREIGN PATENT DOCUMENTS

JP 04-329591 A 11/1992
JP 08-254965 10/1996

(Continued)

OTHER PUBLICATIONS

Japanese Office Action issued Mar. 6, 2012 for the corresponding Japanese Application No. 2007-148699.

(Continued)

*Primary Examiner* — Patrick F Marinelli
(74) *Attorney, Agent, or Firm* — Rader, Fishman & Grauer PLLC

(57) ABSTRACT

In the present invention, there is provided a display panel driving method of the type wherein the total light emitting period length within a one-field period is controlled to variably control the peak luminance level of a display panel, the driving method including a step of variably controlling, where the one-field period has N light emitting periods disposed therein, N being equal to or greater than 2, the light emitting period length of a particular one of the light emitting periods and the other light emitting period or periods to provide a difference in luminance between the particular light emitting period and the other light emitting period or periods so that the particular light emitting period is visually observed as the center of light emission.

23 Claims, 38 Drawing Sheets

(56) References Cited

U.S. PATENT DOCUMENTS

| | | | |
|---|---|---|---|
| 7,106,276 B2 * | 9/2006 | Akiyama | 345/39 |
| 7,573,445 B2 | 8/2009 | Machida | |
| 7,589,700 B2 * | 9/2009 | Miyagawa | 345/77 |
| 7,782,276 B2 * | 8/2010 | Shin | 345/76 |
| 7,800,561 B2 * | 9/2010 | Asano | 345/77 |
| 8,022,907 B2 * | 9/2011 | Park et al. | 345/77 |
| 8,120,554 B2 * | 2/2012 | Kim | 345/82 |
| 2005/0179625 A1 * | 8/2005 | Choi et al. | 345/76 |
| 2006/0071888 A1 * | 4/2006 | Lee et al. | 345/82 |
| 2006/0232717 A1 * | 10/2006 | Kervec et al. | 348/761 |
| 2007/0079191 A1 * | 4/2007 | Shin | 714/726 |
| 2008/0238835 A1 * | 10/2008 | Asano et al. | 345/76 |
| 2008/0303847 A1 * | 12/2008 | Asano | 345/690 |
| 2009/0201286 A1 * | 8/2009 | Hasegawa et al. | 345/214 |

FOREIGN PATENT DOCUMENTS

| | | |
|---|---|---|
| JP | 10-124001 | 5/1998 |
| JP | 10-207426 | 8/1998 |
| JP | 11-231835 A | 8/1999 |
| JP | 2002-514320 A | 5/2002 |
| JP | 2004-093682 A | 3/2004 |
| JP | 2004-510208 A | 4/2004 |
| JP | 2004-191752 A | 7/2004 |
| JP | 2004-191932 A | 7/2004 |
| JP | 2005-027028 | 1/2005 |
| JP | 2005-062283 A | 3/2005 |
| JP | 2005-266751 A | 9/2005 |
| JP | 2005-266752 A | 9/2005 |
| JP | 2006-053236 A | 2/2006 |
| JP | 2006-126779 A | 5/2006 |
| JP | 2006-215213 | 8/2006 |
| JP | 2006-259573 A | 9/2006 |
| JP | 2007-025317 A | 2/2007 |
| JP | 2007-086727 A | 4/2007 |
| JP | 2007-316163 A | 12/2007 |
| JP | 2008-304490 A | 12/2008 |
| JP | 5124985 B2 | 1/2013 |
| JP | 5251006 B2 | 7/2013 |
| JP | 5309475 B2 | 10/2013 |
| KR | 20060123780 A | 12/2006 |
| WO | WO-02/27700 A2 | 4/2002 |
| WO | WO-2004/057561 A1 | 7/2004 |

OTHER PUBLICATIONS

Takikawa, Kei, "TV Display on an AC Plasma Panel" vol. J60-A No. 1, Jan. '77, pp. 56 to 62.

Korean Office Action issued Mar. 31, 2014 for corresponding Korean Application No. 10-2008-0048993.

Japanese Office Action issued Mar. 4, 2014 for corresponding Japanese Application No. 2013-091291.

* cited by examiner

US 8,922,466 B2

DISPLAY PANEL DRIVING METHOD, DISPLAY APPARATUS, DISPLAY PANEL DRIVING APPARATUS AND ELECTRONIC APPARATUS

CROSS REFERENCES TO RELATED APPLICATIONS

The present invention contains subject matter related to Japanese Patent Application JP 2007-148699 filed in the Japan Patent Office on Jun. 5, 2007, the entire contents of which being incorporated herein by reference.

BACKGROUND OF THE INVENTION

1. Field of the Invention

This invention relates generally to a method for controlling the peak luminance level of a display panel, and more specifically to a display panel driving method, a display apparatus, a display panel driving apparatus and an electronic apparatus.

2. Description of the Related Art

In recent years, development of display apparatus of the self-luminous type wherein organic EL (Electro Luminescence) devices are arranged in a matrix has been and is advancing. A display panel which uses an organic EL device is simple and easy in reduction in weight and film thickness and besides is high in response speed, and therefore is superior in a moving picture display characteristic. A display panel which uses an organic EL device is hereinafter referred to also as organic EL panel.

Incidentally, as a driving method for an organic EL panel, a passive matrix driving method and an active matrix driving method are available. Recently, development of a display panel of the active matrix driving type wherein an active device in the form of a thin film transistor and a capacitor are disposed for each pixel circuit is being carried out energetically.

FIG. 1 shows an example of a configuration of an organic EL panel having a variation function of a light emitting period. Referring to FIG. 1, the organic EL panel 1 includes a pixel array section 3, a first scanning line driving section 5 for writing a signal voltage, a second scanning line driving section 7 for controlling the light emitting period, and a data line driving section 9. Pixel circuits 11 are arranged in M rows×N columns in the pixel array section 3. The values of M and N depend upon the display resolution.

It is to be noted that a scanning line VSCAN1 in FIG. 1 is a wiring line for providing a writing timing of a signal voltage. Meanwhile, another scanning line VSCAN2 is a wiring line for providing a start timing and an end timing of a light emitting period. Further, a signal line Vsig is a wiring line for providing a signal voltage corresponding to pixel data.

FIG. 2 shows an example of a configuration of a pixel circuit 11 having a variation function of the light emitting period. It is to be noted that various circuit configurations have been proposed for such pixel circuits. FIG. 2 shows a one of comparatively simple ones of such circuit configurations.

Referring to FIG. 2, the pixel circuit 11 shown includes a write control device T1, a current driving device T2, a light emitting period control device T3, a holding capacitor Cs and an organic EL device OLED.

In the pixel circuit 11 shown in FIG. 2, an N-channel thin film transistor is used for the write control device T1 and a P-channel thin film transistor is used for the current driving device T2 while an N-channel thin film transistor is used for the light emitting period control device T3.

Here, the operation state of the write control device T1 is controlled by the first scanning line VSCAN1 connected to the gate electrode of the write control device T1. When the write control device T1 is in an on state, a signal voltage corresponding to pixel data is written into the holding capacitor Cs through the signal line Vsig.

The signal voltage after written is held in the holding capacitor Cs for a period of time of one field. The signal voltage held in the holding capacitor Cs corresponds to the gate-source voltage Vgs of the current driving device T2.

Accordingly, drain current Ids having a magnitude corresponding to the magnitude of the signal voltage held in the holding capacitor Cs flows to the current driving device T2. As the drain current Ids increases, the current flowing to the organic EL device OLED increases and the emitted light luminance increases.

It is to be noted, however, that supplying and stopping of the drain current Ids to the organic EL device OLED are controlled by the light emitting period control device T3. In particular, the organic EL device OLED emits light only within a period within which the light emitting period control device T3 is in an on state. The operation state of the light emitting period control device T3 is controlled by the second scanning line VSCAN2.

Also a pixel circuit having a circuit configuration shown in FIG. 3 is used for the pixel circuit 11 having a variation function of the light emitting period. Referring to FIG. 3, the pixel circuit 11 shown is generally formed such that the voltage of a power supply line to which the current driving device T2 is connected is variably controlled to control supplying and stopping of the drain current Ids to the organic EL device OLED. The pixel circuit 11 includes a write control device T1, a current driving device T2, a holding capacitor Cs and an organic EL device OLED.

In the pixel circuit 11 shown in FIG. 3, a power supply line to which the source electrode of the current driving device T2 is connected corresponds to the second scanning line VSCAN2. To the second scanning line VSCAN2, a power supply voltage VDD of a high potential or a power supply voltage VSS2 of a low potential lower than a further power supply voltage VDD is supplied. Within a period within which the power supply voltage VDD of the high potential is supplied, the organic EL device OLED emits light, but within another period within which the power supply voltage VSS2 of the low potential is supplied, the organic EL device OLED emits no light.

FIGS. 4 and 5 illustrate relationships between voltages applied to the first scanning line VSCAN1 and the second scanning line VSCAN2 and the driving state of the corresponding pixel. It is to be noted that FIG. 4 illustrates the relationship where the light emitting period is long, and FIG. 5 illustrates the relationship where the light emitting period is short.

Incidentally, FIGS. 4 and 5 illustrate the relationships between the applied voltage and the driving state corresponding to the pixel circuits 11 from the first to third rows of the pixel array section 3. In particular, a numerical value in parentheses represents a corresponding row position.

As seen in FIGS. 4 and 5, a period within which both of the first scanning line VSCAN1 and the second scanning line VSCAN2 have the L level corresponds to a no-light emitting period.

On the other hand, a period within which the first scanning line VSCAN1 has the H level and the second scanning line VSCAN2 has the L level corresponds to a writing period of the signal voltage.

Further, a period within which the first scanning line VSCAN1 has the L level and the second scanning line VSCAN2 has the H level corresponds to a light emitting period.

The reason why a variation function of the light emitting period is incorporated in the pixel circuit 11 in this manner is that such several advantages as described below are achieved.

One of the advantages is that, even if the amplitude of an input signal is not varied, the peak luminance level can be adjusted. FIG. 6 illustrates a relationship between the light emitting period length occupying in a one-field period and the peak luminance level.

As a result, where the input signal is a digital signal, it is possible to adjust the peak luminance level without reducing the gradation number of the signal. On the other hand, where the input signal is an analog signal, since the signal amplitude does not decrease, the noise immunity can be raised. In this manner, variation control of the light emitting period length is effective to implement a pixel circuit which provides high picture quality and can easily adjust the peak luminance.

Further, the variation control of the light emitting period length has an advantage that, where the pixel circuit is of the current writing type, the writing current value can be increased to reduce the writing time.

Furthermore, the variation control of the light emitting period length is advantageous in that it improves the picture quality of moving pictures. It is to be noted that, in FIGS. 7 to 9, the axis of abscissa indicates the position on the screen and the axis of ordinate indicates the elapsed time. All of FIGS. 7 to 9 illustrate a movement of a line of sight where an emission line moves within the screen.

FIG. 7 indicates a display characteristic of the hold type display wherein the light emitting period is given as 100% of a one-field period. A representative one of display apparatus of the type just described is a liquid crystal display apparatus.

FIG. 8 illustrates a display characteristic of the impulse type display apparatus wherein the light emitting period is sufficiently short with respect to a one-field period. A representative one of display apparatus of the type described is a CRT (Cathode Ray Tube) display apparatus.

FIG. 9 illustrates a display characteristic of the hold type display apparatus wherein the light emitting period is limited to 50% of a one-field period.

As can be recognized from comparison of FIGS. 7 to 9, where the light emitting period is 100% of a one-field period as seen in FIG. 7, a phenomenon that the display width looks wider upon movement of a bright spot, that is, a motion artifact, is likely to be perceived.

On the other hand, where the light emitting period is sufficiently shorter than a one-field period as seen in FIG. 8, the display width remains short also upon movement of a bright point. In other words, a motion artifact is not perceived.

Where the light emitting period is 50% of a one-field period as seen in FIG. 9, also upon movement of a bright point, increase of the display width can be suppressed, and motion artifact can be reduced as much.

Generally, it is known that, in the case of moving pictures wherein a one-field period is given by 60 Hz, if the light emitting period is set to 75% or more of a one-field period, then the moving picture characteristic is deteriorated significantly. Thus, it is estimated that preferably the light emitting period is suppressed to less than 50% of a one-field period.

FIGS. 10 and 11 illustrate examples of a driving timing of the second scanning line VSCAN2 where a one-field period includes a single light emitting period. In particular, FIG. 10 illustrates an example of a driving timing where the light emitting period within a one-field period is 50% while FIG. 11 illustrates another example of a driving timing where the light emitting period within a one-field period is 20%. In FIGS. 10 and 11, it is illustrated that the phase relationship makes one cycle with 20 lines.

It is to be noted that the light emitting period corresponding to the sth scanning line VSCAN2(s) can be given by an expression given below. However, it is assumed that a one-field period is given by m horizontal scanning periods, and writing operation into the sth scanning line VSCAN2(s) is carried out within the sth horizontal scanning period and light emission is carried out simultaneously. Further, the ratio of the light emitting period occupying in a one-field period T is represented by DUTY.

At this time, the light emitting period and the no-light emitting period are individually given by the following expressions:

Light emitting period:

$$[(s-1)/m] \cdot T < t < \{[(s-1)/m] + DUTY\} \cdot T$$

No-light emitting period:

$$\{[(s-1)/m] + DUTY\} \cdot T < t < \{[(s-1)/m] + 1\} \cdot T$$

where t satisfies a period given by the following expression:

$$[(s-1)/m] \cdot T < t < \{[(s-1)/m] + 1\} \cdot T$$

Relating techniques are disclosed in JP-A-2002-514320, Japanese Patent Laid-Open No. 2005-027028 and Japanese Patent Laid-Open No. 2006-215213.

SUMMARY OF THE INVENTION

However, where a light emitting period and a no-light emitting period are provided in a one-field period, suppression of flickering becomes a new technical subject to be solved. Generally, in the case of moving pictures whose one-field period is given by 60 Hz, it is known that, if the light emitting period is set lower than 25% of a one-field period, then flickering is actualized, and it is considered desirable to set the light emitting period equal to or longer than 50% of a one-field period.

In particular, it is known that, in restriction to the light emitting period, two items of the picture quality of moving pictures and flickering have a tradeoff relationship, and the setting range of the light emitting period is restricted by the tradeoff relationship. However, the restriction to the setting range leads to restriction of the variation range of the peak luminance level.

Therefore, as a method of reducing flickering where the light emitting period is short, a method of dividing a light emitting period within a one-field period into a plurality of periods has been proposed.

FIGS. 12 and 13 illustrate relationships between the voltages applied to the first scanning line VSCAN1 and the second scanning line VSCAN2 and the driving state of a corresponding pixel. In particular, FIG. 12 illustrates a relationship where the light emitting period is long while FIG. 13 illustrates a relationship where the light emitting period is short.

Incidentally, FIGS. 12 and 13 illustrate relationships between the applied voltage and the driving state corresponding to the pixel circuits 11 in the first to third rows of the pixel array section 3. In particular, a numerical value in parentheses represents a corresponding row position.

FIGS. 14 and 15 illustrate examples of a driving timing of the second scanning line VSCAN2 where a one-field period includes two light emitting periods. In the existing driving methods illustrated in FIGS. 14 and 15, one field is divided into a former half period and a latter half period, and the light emitting period is varied for each of the half periods. In particular, within the former half period, the light emitting period length is varied with reference to a reference point which is 0% of the one-field period, and within the latter half period, the light emitting period is varied with reference to a reference point which is 50% of the one-field period.

Incidentally, FIG. 14 illustrates an example of a driving timing where the total light emitting period within a one-field period is 50%, and FIG. 15 illustrates another example of a driving method wherein the total light emitting period within a one-field period is 20%. Also FIGS. 14 and 15 present that the phase relationship makes one cycle with 20 lines.

Where a one-field period includes two light emitting periods, the light emitting period corresponding to the sth scanning line VSCAN2(s) can be given by an expression given below. It is to be noted, however, that a one-field period is given as m horizontal scanning periods, and writing operation into the sth scanning line VSCAN2(s) is carried out within the sth horizontal scanning period and emission of light is started simultaneously. Further, the ratio of the light emitting period occupying in the one-field period T is represented by DUTY.

At this time, the light emitting period and the no-light emitting period are individually given by the following expressions:

Light emitting period in former half period:

$[(s-1)/m] \cdot T < t < \{[(s-1)/m] + DUTY/2\} \cdot T$

No-light emitting period in former half period:

$\{[(s-1)/m] + DUTY/2\} \cdot T < t < \{[(s-1)/m] + 1/2\} \cdot T$

Light emitting period in latter half period:

$[(s-1)/m + 1/2] \cdot T < t < \{[(s-1)/m] + (1+DUTY)/2\} \cdot T$

No-light emitting period in latter half period:

$\{[(s-1)/m] + (1+DUTY)/2\} \cdot T < t < \{[(s-1)/m] + 1\} \cdot T$ where t satisfies a period given by the following expression:

$[(s-1)/m] \cdot T < t < \{[(s-1)/m] + 1\} \cdot T$

However, in the driving method wherein a one-field period is divided into a former half period and a latter half period, where the total light emitting period is 50% of a one-field period, light emission of 25%→no-light emission of 25%→light emission of 25%→no-light emission of 25% occurs repetitively.

According to this form of light emission, a movement of a line of sight same as that where the light emitting period is 75% of a one-field period occurs.

In other words, in the driving method wherein a one-field period is simply divided into a former half period and a latter half period, while flickering can be reduced, there is a technical subject to be solved in that motion artifact occurs and deteriorates the picture quality of moving pictures.

In addition, since the former half period and the latter half period exhibit an equal ratio in light emission, there is another subject in that moving display of a straight line is likely to be visually observed as two straight lines.

Therefore, it is demanded to provide a driving technique for a display panel wherein the peak luminance level can be adjusted over a wide range while both of motion artifact and flickering can be suppressed.

An embodiment according to the present invention proposes a method of and an apparatus for variably controlling, where a one-field period has N light emitting periods disposed therein, N being equal to or greater than 2, the light emitting period length of a particular one of the light emitting periods and the other light emitting period or periods to provide a difference in luminance between the particular light emitting period and the other light emitting period or periods so that the particular light emitting period is visually observed as the center of light emission.

Where the method or apparatus is adopted, even where a one-field period has N light emitting periods disposed therein, N being equal to or greater than 2, a difference in luminance can be provided between the light emitting period at the center of light emission and the other light emitting period or periods.

Consequently, a difference in luminance can be provided clearly between an image visually observed principally and any other image. As a result, a multiple overlapping phenomenon of images of a substantially equal luminance which makes a cause of motion artifact can be reduced. Consequently, even where the peak luminance level is to be adjusted over a wide range, deterioration of the picture quality can be suppressed.

BRIEF DESCRIPTION OF THE DRAWINGS

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

In the following, an organic EL panel of the active matrix driving type to which embodiments according to the present invention are applied is described.

It is to be noted that, to those matters which are not disclosed in the present specification and the accompanying drawings, techniques which are known in the technical field to which an embodiment according to the present invention belongs are applied.

A. Structure of the Organic EL Panel

Figure 17:
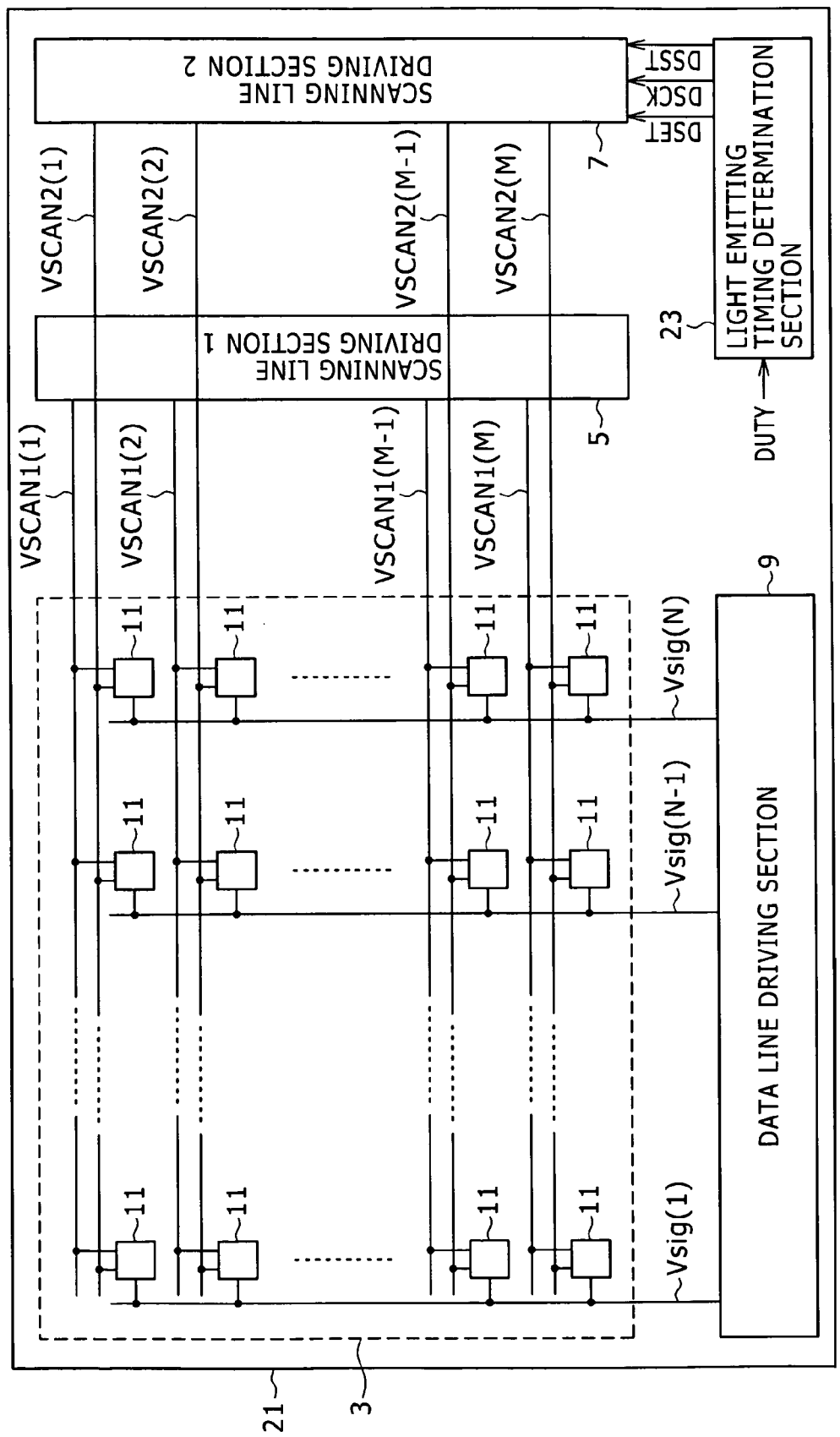
FIG. 17 is a circuit diagram showing an example of a general configuration of an organic EL panel to which an embodiment of the present invention is applied.

FIG. 17 shows an example of a general configuration of an organic EL panel to which an embodiment according to the present invention is applied.

Referring to FIG. 17, the organic EL panel 21 includes a pixel array section 3, a first scanning line driving section 5 for writing a signal voltage, a second scanning line driving section 7 for controlling the light emitting period, a data line driving section 9, and a light emitting timing determination section 23. The pixel array section 3 includes pixel circuits 11 arranged in M rows×N columns. The values of M and N depend upon the display resolution.

The light emitting timing determination section 23 is a component unique to the organic EL panel 21. A total light emitting period (ratio DUTY) occupying within a one-field period T is provided to the light emitting timing determination section 23. The light emitting timing determination section 23 determines arrangement of light emitting periods so as to satisfy the total light emitting period (ratio DUTY) provided thereto. Here, the arrangement of the light emitting periods is determined for each second scanning line VSCAN2.

Although a particular determination method of light emitting periods is hereinafter described, where a plurality of light emitting periods are to be arranged in a one-field period, the light emitting timing determination section 23 variably controls the light emitting period lengths of a particular light emitting period and the other light emitting periods so that the particular light emitting period becomes the center of light emission. The light emitting timing determination section 23 and the second scanning line driving section 7 correspond to a "display panel driving section".

It is to be noted that, in order to reduce flickering and motion artifact to improve the picture quality, it is desirable to determine timings such that the period length from a start timing of the first-time light emitting period to an end timing of the last-time light emitting period becomes equal to or longer than 25% of a one-field period but equal to or shorter than 75% of a one-field period.

The light emitting timing determination section 23 operates to supply a start pulse DSST for providing a start timing of each light emitting period and an end pulse DSET for providing an end timing of each light emitting period to the second scanning line driving section 7 together with a clock DSCK.

B. Driving Examples

B-1. Driving Example 1 of the Display Panel

Here, where two light emitting periods are arranged in a one-field period, a driving example of variably driving the length of the light emitting periods such that the ratio between the first and second light emitting period lengths is 3:1 is described.

Figure 18:
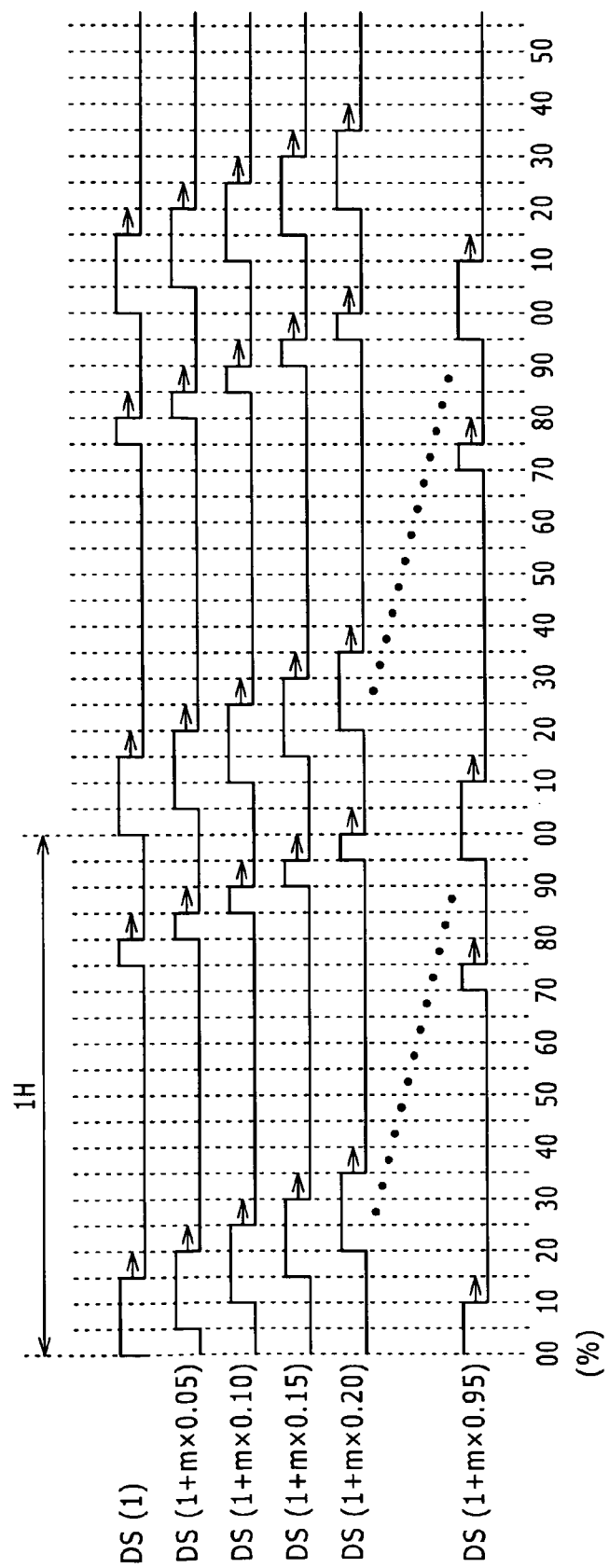
FIGS. 18 and 19 are timing charts illustrating different examples of a driving timing of the organic EL panel of FIG. 17 according to a driving example 1.
Figure 19:
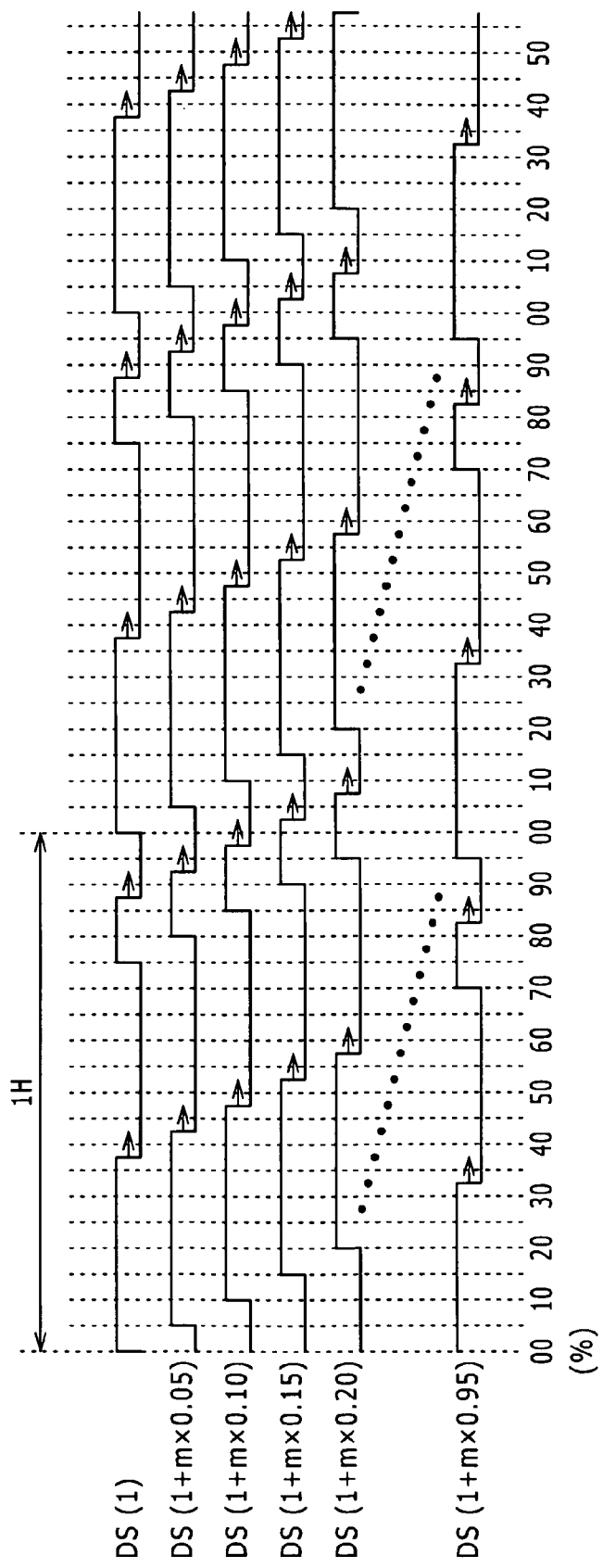

FIGS. 18 and 19 illustrate examples of a driving timing of the second scanning line VSCAN2 where a one-field period includes two light emitting periods. In both of the examples of FIGS. 18 and 19, the start timing of the first-time light emitting period is fixed to 0% of a one-field period, and the start timing of the second-time light emitting period is fixed to 75% of a one-field period. It is to be noted that FIG. 18 corresponds to a case wherein the total light emitting period length is comparatively short, but FIG. 19 corresponds to another case wherein the total light emitting period length is comparatively long.

Incidentally, while it is represented in FIGS. 18 and 19 that the phase relationship makes one cycle with 20 lines similarly as in the examples of related art described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, the following calculation expressions are represented such that a one-field period is given by m horizontal scanning periods. Further, the sth scanning line VSCAN2(s) is represented such that writing operation is carried out within the sth horizontal scanning period and emission of light is started simultaneously. Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

First-time light emitting period:

$$[(s-1)/m] \cdot T < t < \{[(s-1)/m] + DUTY \cdot (3/4)\} \cdot T$$

First-time no-light emitting period:

$$\{[(s-1)/m] + DUTY \cdot (3/4)\} \cdot T < t < \{[(s-1)/m] + 0.75\} \cdot T$$

Second-time light emitting period:

$$\{[(s-1)/m] + 0.75\} \cdot T < t < \{[(s-1)/m] + 0.75 + DUTY \cdot (1/4)\} \cdot T$$

Second-time no-light emitting period:

$$\{[(s-1)/m]+0.75+\text{DUTY}\cdot(1/4)\}T<t<\{[(s-1)/m]+1\}\cdot T$$

where t is a period which satisfies the following expression:

$$[(s-1)/m]\cdot T<t<\{[(s-1)/m]+1\}\cdot T$$

In the present driving example, the length of the first-time light emitting period is equal to three times the length of the second-time light emitting period. Accordingly, even if two light emitting periods exist within a one-field period, principally the first-time light emitting period is visually observed due to the difference in luminance between the two light emitting periods. As a result, a phenomenon that an image is visually observed in double vision can be reduced significantly.

It is to be noted that, in the case of the present driving example, the total light emitting period can be variably controlled within the range of 0% to 100%. Accordingly, the present driving example is effective to maximize the light emitting luminance of the organic EL panel.

However, as described above, in the present driving example, the adjustment step of the first-time light emitting period normally has a time length equal to three times that of the adjustment step of the second-time light emitting period. This is because the light emitting periods are controlled so that the ratio in length between the first- and second-time light emitting periods becomes 3:1.

Figure 20:
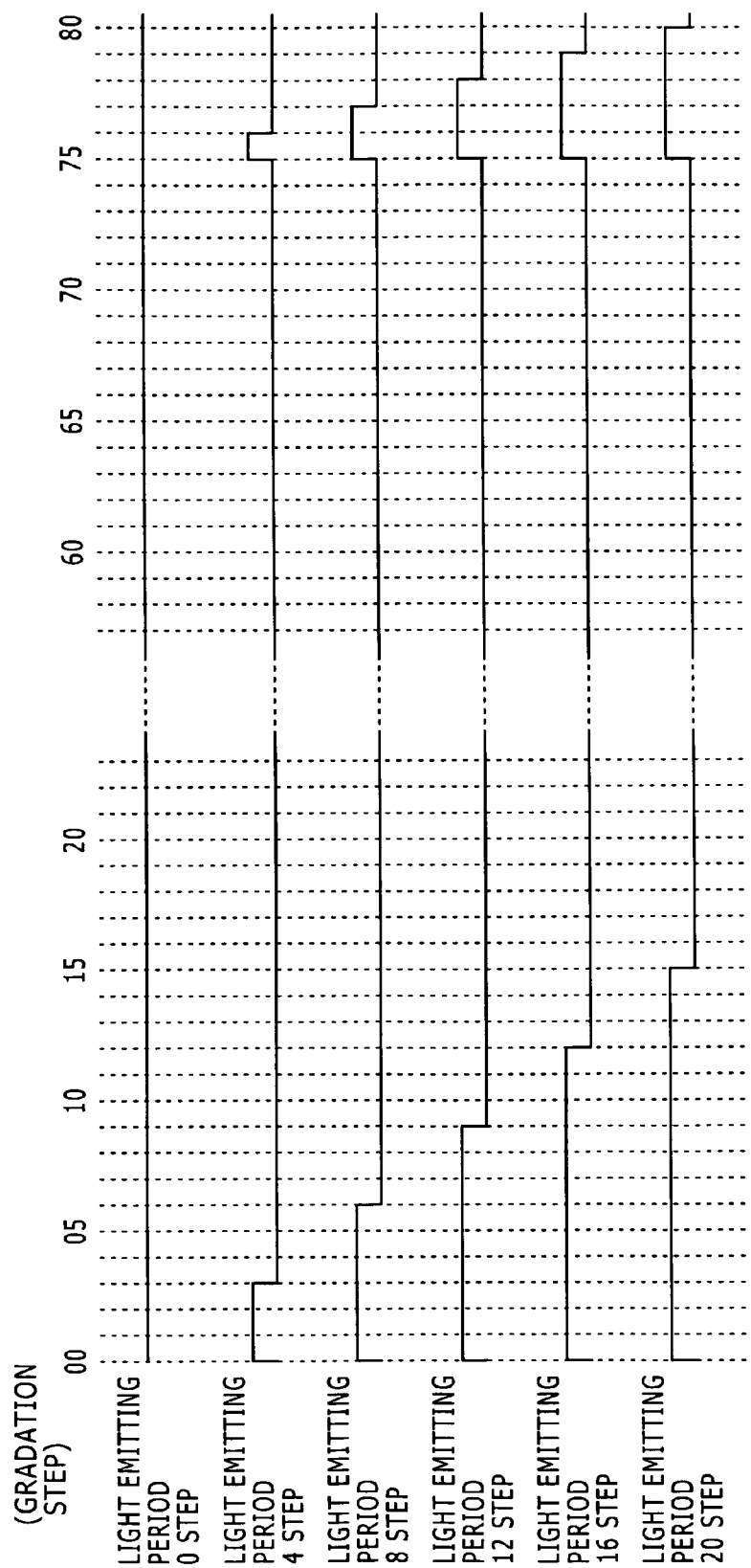
FIG. 20 is a timing chart illustrating a variation of an adjustment step of a light emitting period in the organic EL panel of FIG. 17 according to the driving example 1.

Accordingly, in the present driving example, the adjustment step number of the adjustable luminance level decreases to one fourth that where a single light emitting period is involved as seen in FIG. 20. On the other hand, the adjustment step width of the luminance level increases to four times that where one light emitting period is involved.

Accordingly, in order to make control of the luminance level smooth, it is necessary, for example, to reduce one adjustment step. In the present example, if one adjustment step is set to one fourth 1%, that is, to 0.25, then the variation unit of the luminance level can be made coincide with that in the case wherein one light emitting period is involved.

However, there is the possibility also that the result of calculation based on the expressions given hereinabove may be smaller than one adjustment step depending on the size of one adjustment step. In such an instance, although strictly speaking the relationship of 3:1 is not satisfied, addition and deletion of adjustment steps may be repeated in preceding and succeeding fields to cope with this instance.

Figure 21:
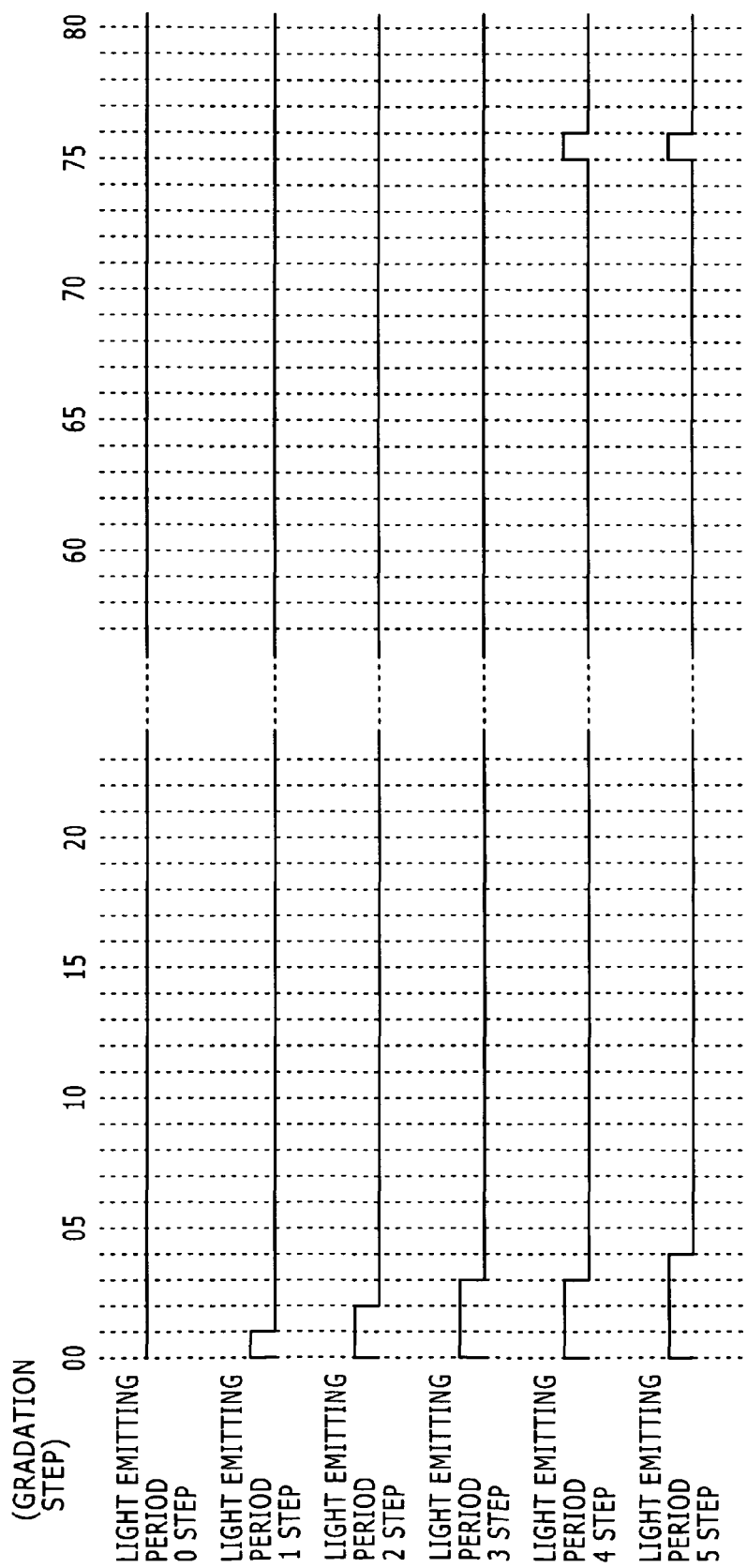
FIG. 21 is a timing chart illustrating a different adjustment step in the organic EL panel of FIG. 17.

Or, the light emitting period length may be controlled one by one adjustment step within the range of adjustment steps allocated to each light emitting period as seen in FIG. 21. In this instance, a case occurs wherein the lengths of the first-time light emitting period and the second-time light emitting period are not adjusted simultaneously. Accordingly, it is impossible to apply the expressions given hereinabove, and also it is impossible to satisfy the relationship of 3:1.

However, also in this instance, since the luminance difference between the first-time light emitting period and the second-time light emitting period can be kept equal to or higher than 3:1, double vision of an image can be reduced.

It is to be noted that such controlling techniques of adjustment steps can be applied also to the other driving examples described below.

B-2. Driving Example 2 of the Display Panel

In the driving example 1 described above, a one-field period can be utilized to the utmost for control of the peak luminance level. However, since the start timing of the second-time light emitting period is the position of 75%, even where the total light emitting period length is short, it is difficult to be avoided that the apparent light emitting period length becomes long. Therefore, there is the possibility that motion artifact may matter.

Therefore, in the driving example described below, the maximum value of the total light emitting period length (ratio DUTY) for providing an adjustment amount of a peak luminance level is set to 60% of a one-field period. It is to be noted that, also in the present driving example, the ratio between the length of the first-time light emitting period and the length of the second-time light emitting period is 3:1.

Figure 22:
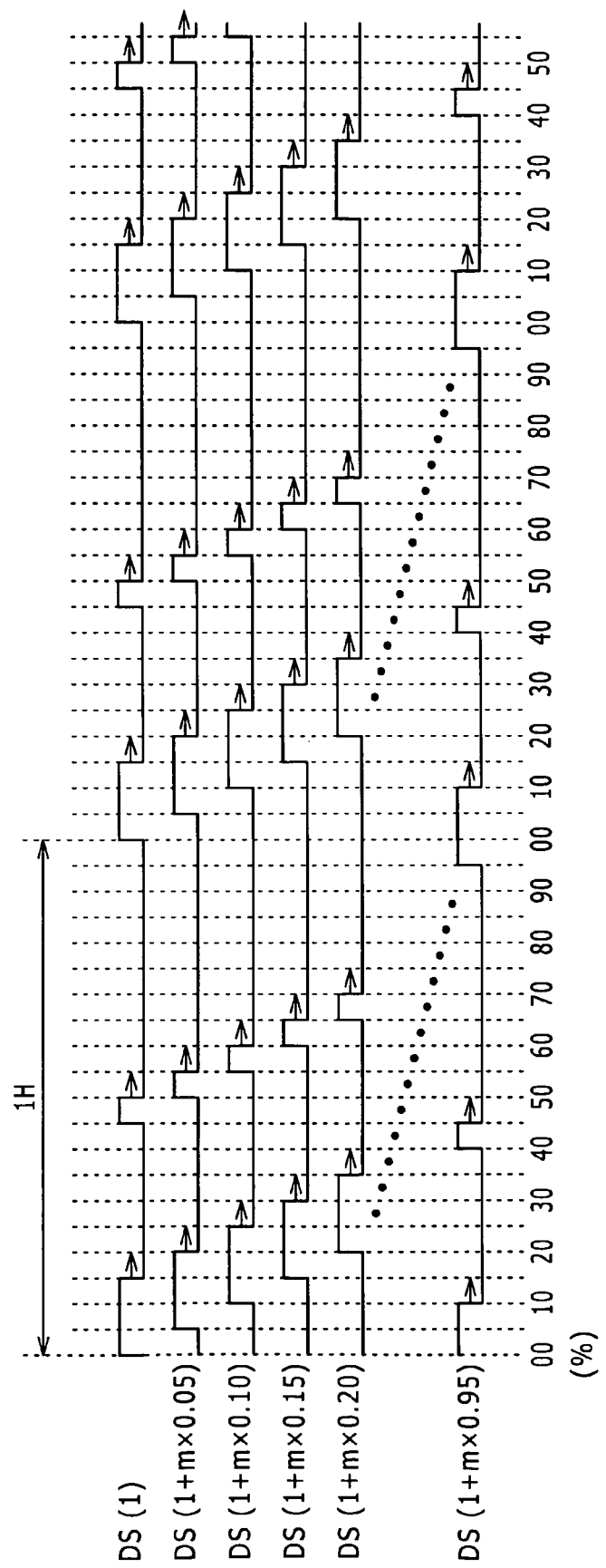
FIGS. 22 and 23 are timing charts illustrating different examples of a driving timing of the organic EL panel of FIG. 17 according to a driving example 2.
Figure 23:
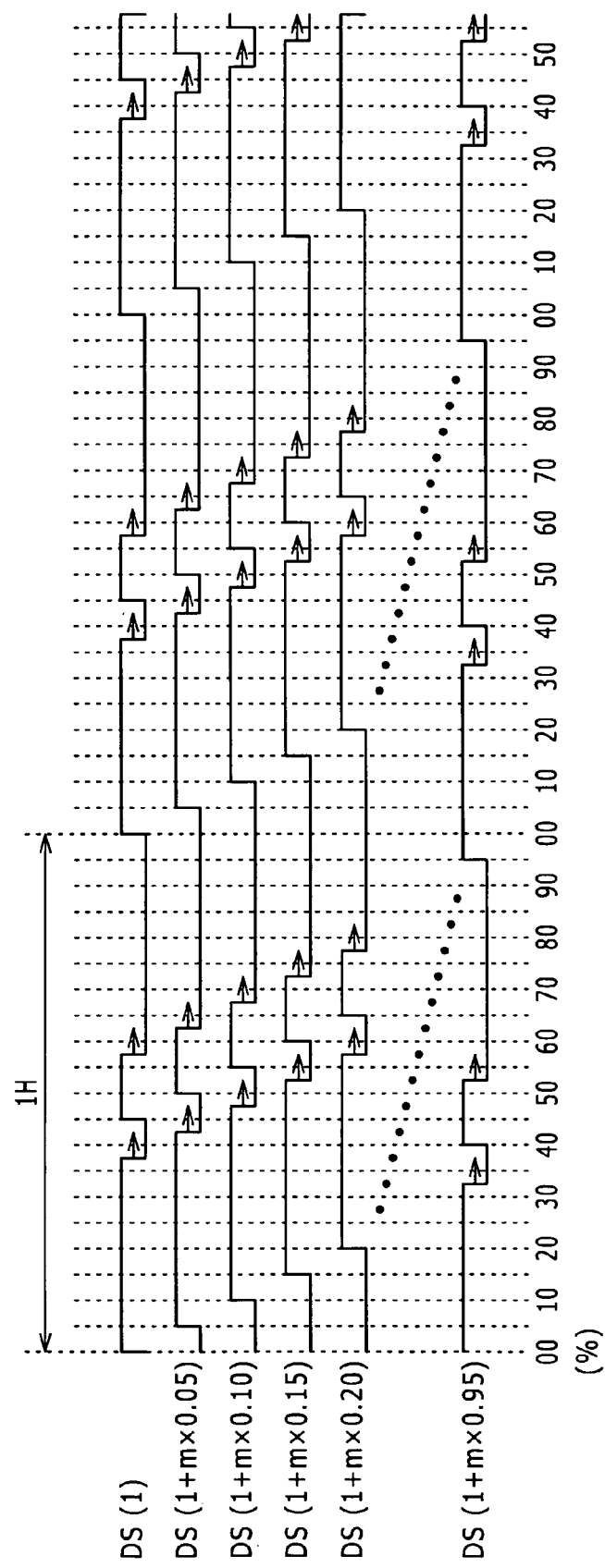

FIGS. 22 and 23 illustrate examples of a driving timing of the second scanning line VSCAN2 compatible with the present driving technique. In both of the examples of FIGS. 22 and 23, the start timing of the first-time light emitting period is fixed to 0% of a one-field period, and the start timing of the second-time light emitting period is fixed to 45% of a one-field period. It is to be noted that FIG. 22 corresponds to a case wherein the total light emitting period length is comparatively short, but FIG. 23 corresponds to another case wherein the total light emitting period length is comparatively long.

Incidentally, while it is represented in FIGS. 22 and 23 that the phase relationship makes one cycle with 20 lines similarly as in the examples of related art described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where 0<DUTY<0.6,

First-time light emitting period:

$$[(s-1)/m]\cdot T<t<\{[(s-1)/m]+\text{DUTY}\cdot(3/4)\}\cdot T$$

First-time no-light emitting period:

$$\{[(s-1)/m]+\text{DUTY}\cdot(3/4)\}\cdot T<t<\{[(s-1)/m]+0.45\}\cdot T$$

Second-time light emitting period:

$$\{[(s-1)/m]+0.75\}\cdot T<t<\{[(s-1)/m]+0.45+\text{DUTY}\cdot(1/4)\}\cdot T$$

Second-time no-light emitting period:

$$\{[(s-1)/m]+0.45+\text{DUTY}\cdot(1/4)\}\cdot T<t<\{[(s-1)/m]+1\}\cdot T$$

If the present driving example is adopted, then the total light emitting period length (ratio DUTY) occupying in a one-field period T can be adjusted within the range of 0% to 60% of the one-field period T.

From the point of view of motion artifact or flickering, according to the present driving example, the apparent light emitting period can be controlled from 45% to 60%.

Consequently, deterioration of the picture quality can be suppressed from the point of view of both of flickering and motion artifact.

In this manner, where the driving example 2 is used, the peak luminance level can be adjusted over a wide range while deterioration of the picture quality is suppressed.

B-3. Driving Example 3 of the Display Panel

In the driving example 2 described above, the method wherein the start timing of the individual light emitting periods is fixed and the end timing of the individual light emitting periods is delayed in accordance with increase of the total light emitting period length.

In the present driving example 3 described below, individual light emitting period lengths are variably controlled such that, in a state wherein the length between the start timing of the first-time light emitting period and the end timing of the second-time light emitting period is fixed, the gap between the two light emitting periods is filled up.

In particular, the end timing of the first-time light emitting period and the start timing of the second-time light emitting period are variably controlled in response to the total light emitting period length (ratio DUTY).

Figure 24:
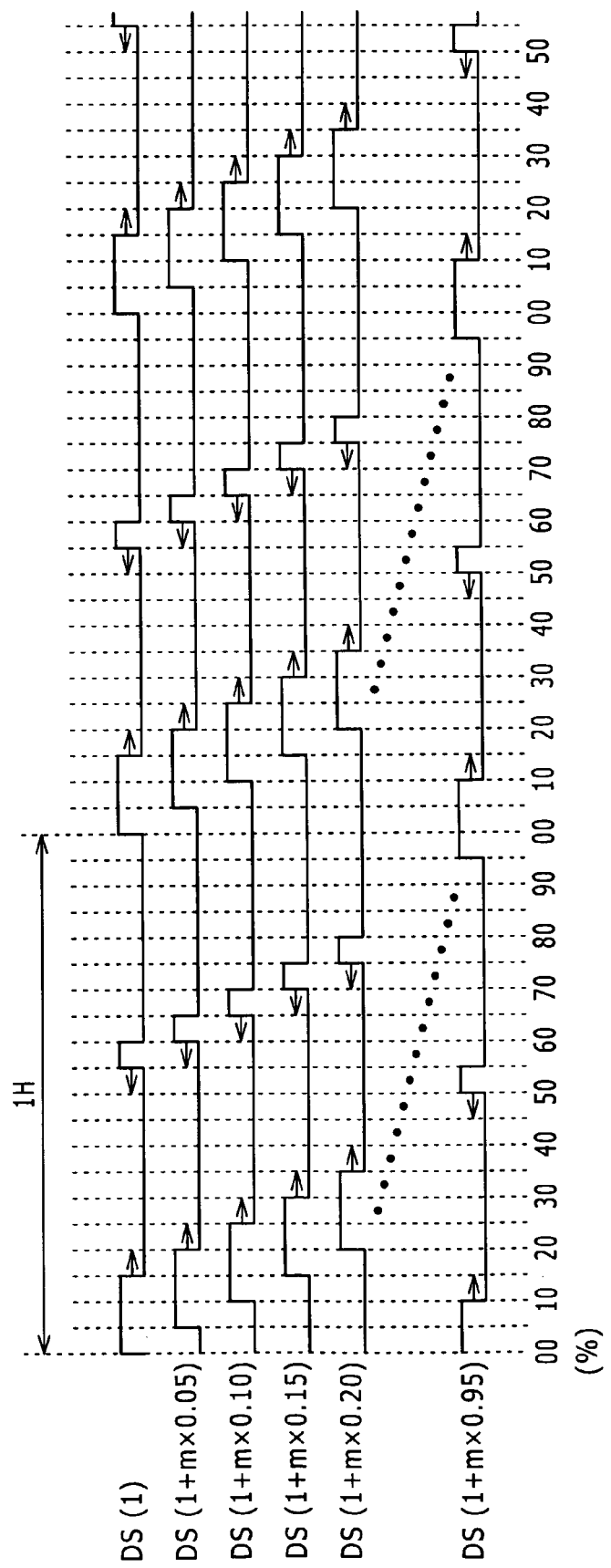
FIGS. 24 and 25 are timing charts illustrating different examples of a driving timing of the organic EL panel of FIG. 17 according to a driving example 3.
Figure 25:
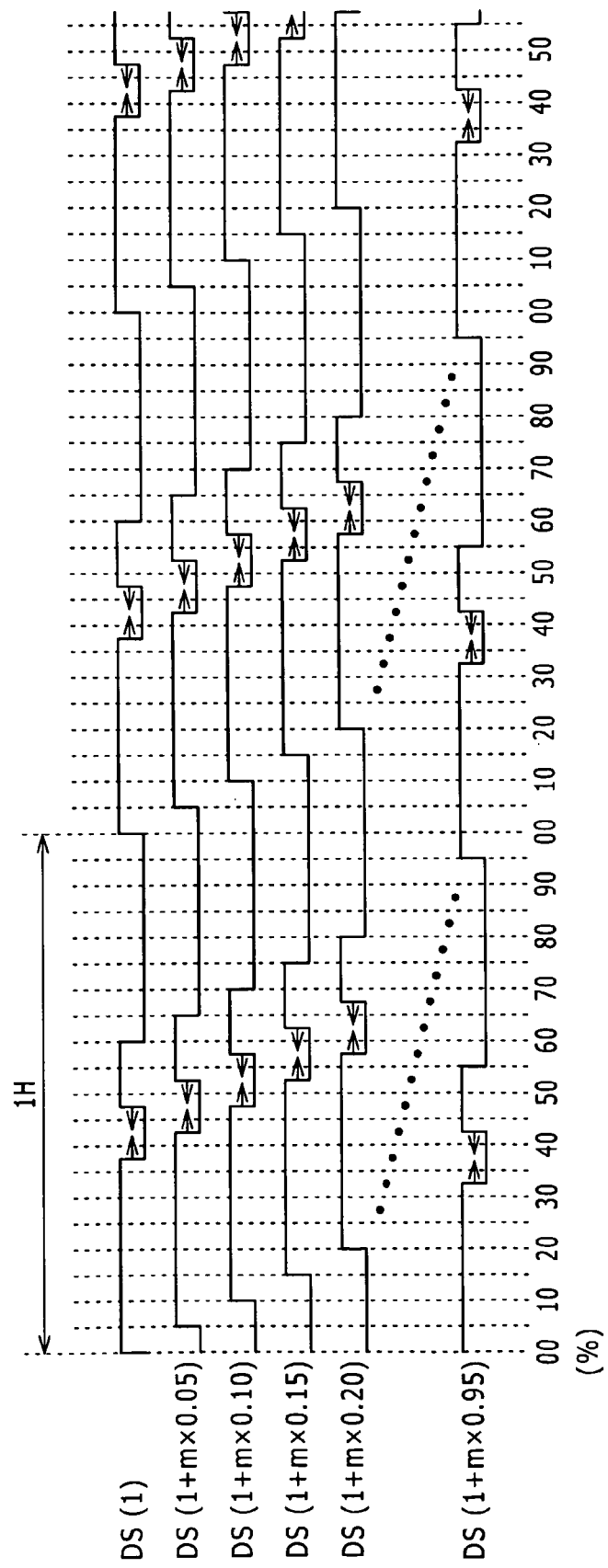

FIGS. 24 and 25 illustrate an example of driving timings of the second scanning line VSCAN2 corresponding to the present driving technique.

It is to be noted that both of FIGS. 24 and 25 correspond to a case wherein the maximum value of the total light emitting period length (ratio DUTY) for providing an adjustment amount of a peak luminance level is set to 60% of a one-field period. Further, also in the present driving example, the ratio between the length of the first-time light emitting period and the length of the second-time light emitting period is 3:1.

Therefore, in the examples of FIGS. 24 and 25, the start timing of the first-time light emitting period is fixed to 0% of a one-field period, and the end timing of the second-time light emitting period is fixed to 60% of a one-field period. It is to be noted that FIG. 24 corresponds to a case wherein the total light emitting period length is comparatively short, but FIG. 25 corresponds to another case wherein the total light emitting period length is comparatively long.

Incidentally, while it is represented in FIGS. 24 and 25 that the phase relationship makes one cycle with 20 lines similarly as in the examples of related art described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where 0<DUTY<0.6,

First-time light emitting period:

$[(s-1)/m] \cdot T < t < \{[(s-1)/m] + DUTY \cdot (3/4)\} \cdot T$

First-time no-light emitting period:

$\{[(s-1)/m] + DUTY \cdot (3/4)\} \cdot T < t < \{[(s-1)/m] + 0.6 - DUTY \cdot (1/4)\} \cdot T$ Second-time light emitting period:

$\{[(s-1)/m] + 0.6 - DUTY \cdot (1/4)\} \cdot T < t < \{[(s-1)/m] + 0.6\} \cdot T$ Second-time no-light emitting period:

$\{[(s-1)/m] + 0.6\} \cdot T < t < \{[(s-1)/m] + 1\} \cdot T$

From the foregoing, also in the present driving example, the total light emitting period length (ratio DUTY) occupying in a one-field period T can be adjusted within the range of 0% to 60% of the one-field period T.

From the point of view of motion artifact or flickering, according to the present driving example, the apparent light emitting period can be controlled to 60%.

Consequently, deterioration of the picture quality can be suppressed from the point of view of both of flickering and motion artifact.

In this manner, where the driving example 3 is used, the peak luminance level can be adjusted over a wide range while deterioration of the picture quality is suppressed.

However, as described above, also in the present driving example, the adjustment step of the first-time light emitting period normally has a time length equal to three times that of the adjustment step of the second-time light emitting period.

Accordingly, also in the present driving example, the adjustment step of the adjustable luminance level decreases to one fourth that where a single light emitting period is involved. On the other hand, the variation unit of the luminance level increases to four times that where one light emitting period is involved.

Accordingly, in order to make control of the luminance level smooth, it is necessary, for example, to reduce one adjustment step. In the case of the present example, if one adjustment step is set to one fourth 1%, that is, to 0.25, then the variation unit of the luminance level can be made coincide with that in the case wherein one light emitting period is involved.

However, there is the possibility also that the result of calculation based on the expressions given hereinabove may be smaller than one adjustment step depending on the size of one adjustment step. In such an instance, although strictly speaking the relationship of 3:1 is not satisfied, addition and deletion of adjustment steps may be repeated in preceding and succeeding fields to cope with this instance.

Figure 26:
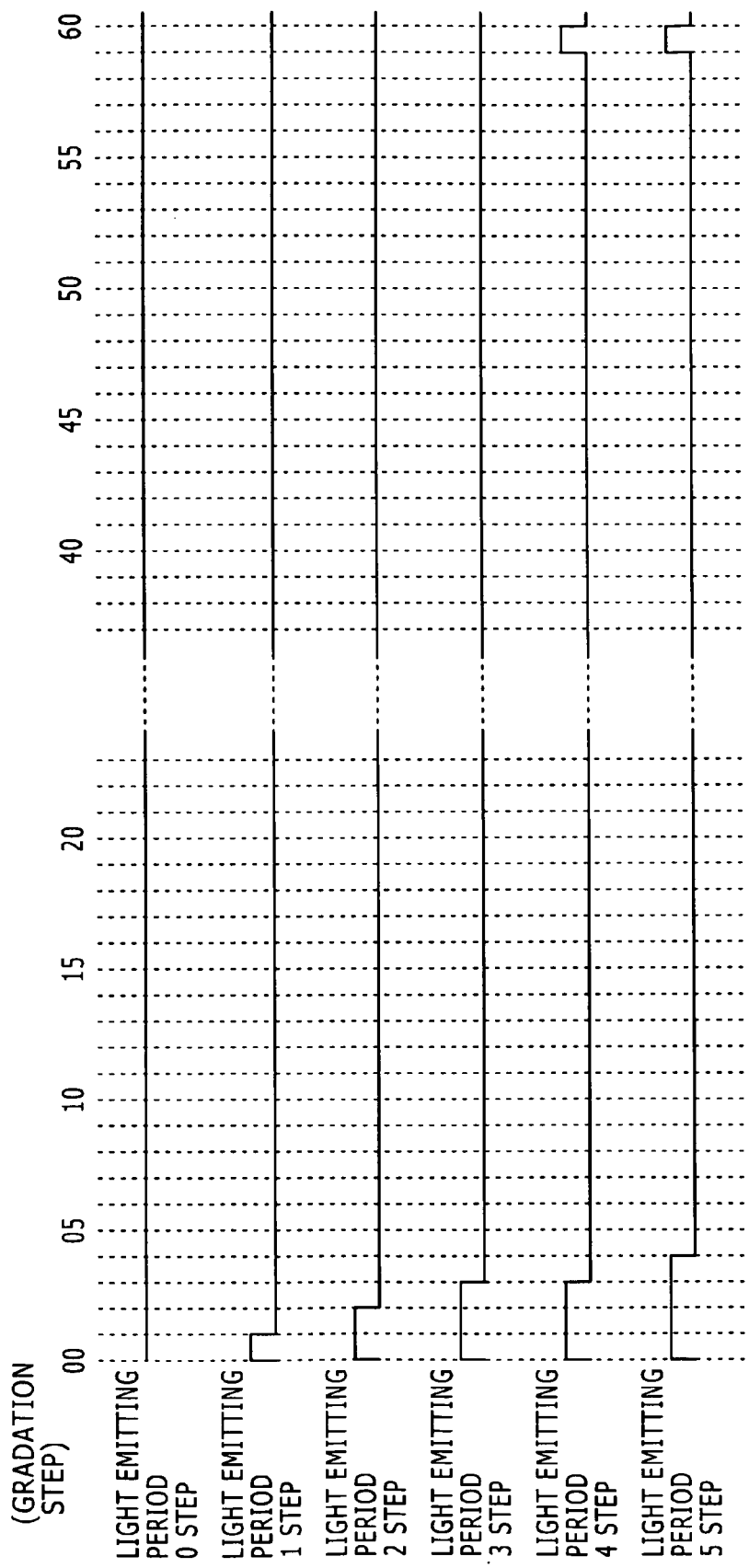
FIG. 26 is a timing chart illustrating another different adjustment step in the organic EL panel of FIG. 17.

Or, the light emitting period length may be controlled one by one adjustment step within the range of adjustment steps allocated to each light emitting period as seen in FIG. 26. In this instance, a case occurs wherein the lengths of the first-time light emitting period and the second-time light emitting period are not adjusted simultaneously. Accordingly, it is impossible to apply the expressions given hereinabove, and also it is impossible to satisfy the relationship of 3:1.

However, also in this instance, since the luminance difference between the first-time light emitting period and the second-time light emitting period can be kept equal to or higher than 3:1, generally the possibility that an image may be visually observed in double vision can be reduced.

It is to be noted that such controlling techniques of adjustment steps can be applied also to the other driving examples described below.

B-4. Driving Example 4 of the Display Panel

Here, a driving example other than the driving examples described hereinabove is described. In the present driving example, both of the start timing and the end timing of one light emitting period from two light emitting periods are variably controlled simultaneously in response to the total light emitting period length (ratio DUTY).

Therefore, in the present driving example, a one-field period is equally divided into three periods. As an allocation method into such three periods, a method wherein the first and the second periods are allocated to the first-time light emitting period and the third period is allocated to the second-time light emitting period and another method wherein the first period is allocated to the first-time light emitting period and the second and third periods are allocated to the second-time light emitting period.

In both cases, two periods allocated to one light emitting period correspond to former and latter halves of the light emitting period.

It is to be noted that, in the present driving example, a reference point as a fixed point is set to a light emitting period to which two periods are allocated. The start timing and the end timing of the light emitting period are determined with reference to the reference point.

In particular, the start timing is set as a timing of one third of the total light emitting period length (ratio DUTY) preceding to the reference point, and the end timing is set as a timing of one third of the total light emitting period length (ratio DUTY) following the reference point.

In the following description, the maximum value of the total light emitting period length (ratio DUTY) is set to 60%, and the point of 40% which is the position at ⅔ of the maximum variation range is set as the reference point to the second-time light emitting period. In other words, the ratio between the length of the first-time light emitting period and the length of the second-time light emitting period is se to 1:2. In this instance, the variation range of the first-time light emitting period is given by 0% to 20%, and the variation range of the second-time light emitting period is given by 20% to 60%.

Figure 27:
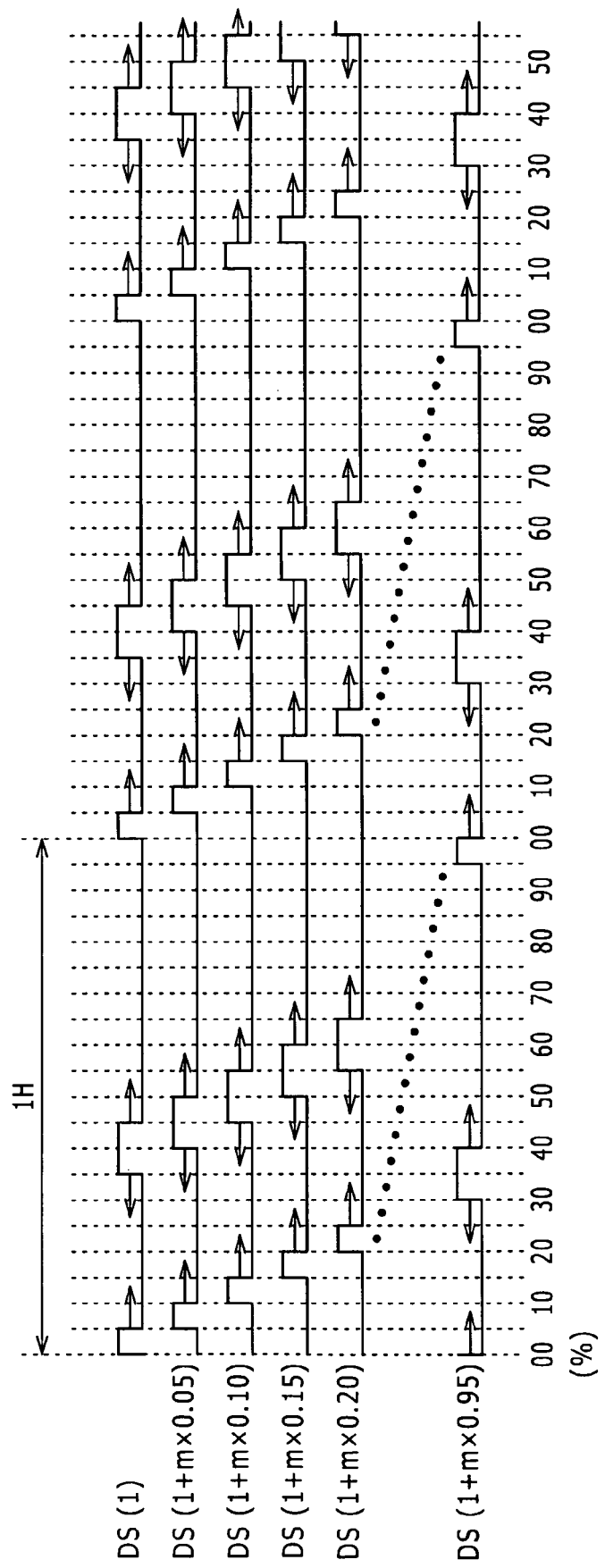
FIGS. 27 and 28 are timing charts illustrating different examples of a driving timing of the organic EL panel of FIG. 17 according to a driving example 4.
Figure 28:
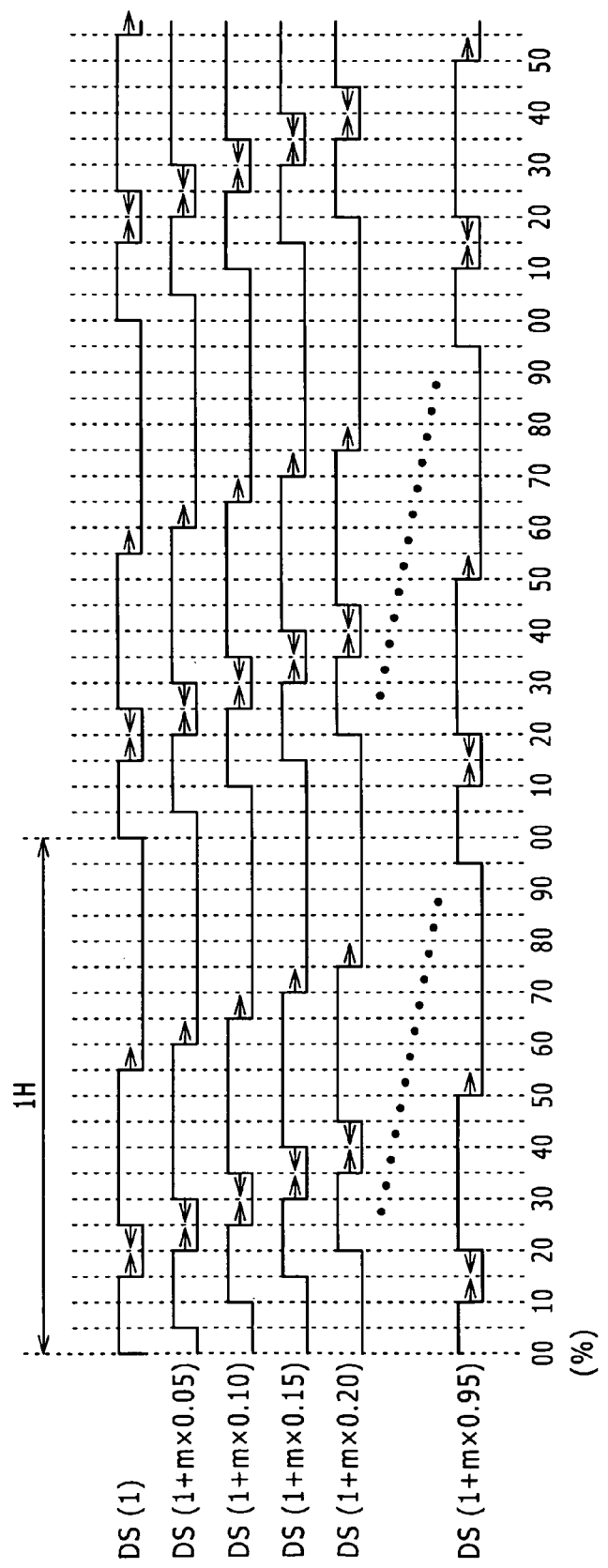

FIGS. 27 and 28 illustrate examples of driving timings of the second scanning line VSCAN2 corresponding to the present driving technique.

It is to be noted that FIG. 27 corresponds to a case wherein the total light emitting period length is comparatively short, but FIG. 28 corresponds to another case wherein the total light emitting period length is comparatively long.

Incidentally, while it is represented also in FIGS. 27 and 28 that the phase relationship makes one cycle with 20 lines similarly as in the driving examples described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, also the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where $0<DUTY<0.6$,

First-time light emitting period:

$$[(s-1)/m]\cdot T<t<\{[(s-1)/m]+DUTY\cdot(1/3)\}\cdot T$$

First-time no-light emitting period:

$$\{[(s-1)/m]+DUTY\cdot(1/3)\}\cdot T<t<\{[(s-1)/m]+0.4-DUTY\cdot(1/3)\}\cdot T$$

Second-time light emitting period:

$$\{[(s-1)/m]+0.4-DUTY\cdot(1/3)\}\cdot T<t<\{[(s-1)/m]+0.4+DUTY\cdot(1/3)\}\cdot T$$

Second-time no-light emitting period:

$$\{[(s-1)/m]+0.4+DUTY\cdot(1/3)\}\cdot T<t<\{[(s-1)/m]+1\}\cdot T$$

As described above, also in the case of the present driving example, the total light emitting period length (ratio DUTY) occupying in a one-field period T can be adjusted within the range of 0% to 60% of the one-field period T.

From the point of view of motion artifact or flickering, according to the present driving example, the apparent light emitting period can be controlled from 40% to 60%.

Consequently, deterioration of the picture quality can be suppressed from the point of view of both of flickering and motion artifact.

In this manner, where the driving example 3 is used, the peak luminance level can be adjusted over a wide range while deterioration of the picture quality is suppressed.

B-5. Driving Example 5 of the Display Panel

Here, a driving example is described wherein three light emitting periods are arranged in a one-field period.

Also in this instance, as a controlling method for the light emitting periods, a method wherein the light emitting period lengths have a monotonously increasing relationship thereamong (length of light emitting period 1<length of light emitting period 2<length of light emitting period 3) and another method wherein the light emitting period lengths have a monotonously decreasing relationship thereamong (length of light emitting period 1>length of light emitting period 2>length of light emitting period 3) are available.

Here, however, a further method wherein the light emitting period length of the second light emitting period is set longest is described. This is because the second light emitting period is positioned at the center of the light emitting periods and besides, where moving images look multiply, one of the images which is positioned at the center looks most clearly.

Here, variable control of the end timings of light emitting periods so that the light emitting period lengths of the light emitting periods may satisfy a relationship of 1:2:1 is described.

It is to be noted that the maximum value of the total light emitting period (ratio DUTY) within which the adjustment amount for the peak luminance level is 100% of a one-field period.

In particular, an example wherein 25% are allocated to the first-time light emitting period, 50% to the second-time light emitting period and 25% the third-light emitting period is described.

Accordingly, in the present driving example, the start timing of the first-time light emitting period is fixed to 0%, the start timing of the second-time light emitting period to 25%, and the start timing of the third-time light emitting period to 75%.

Figure 29:
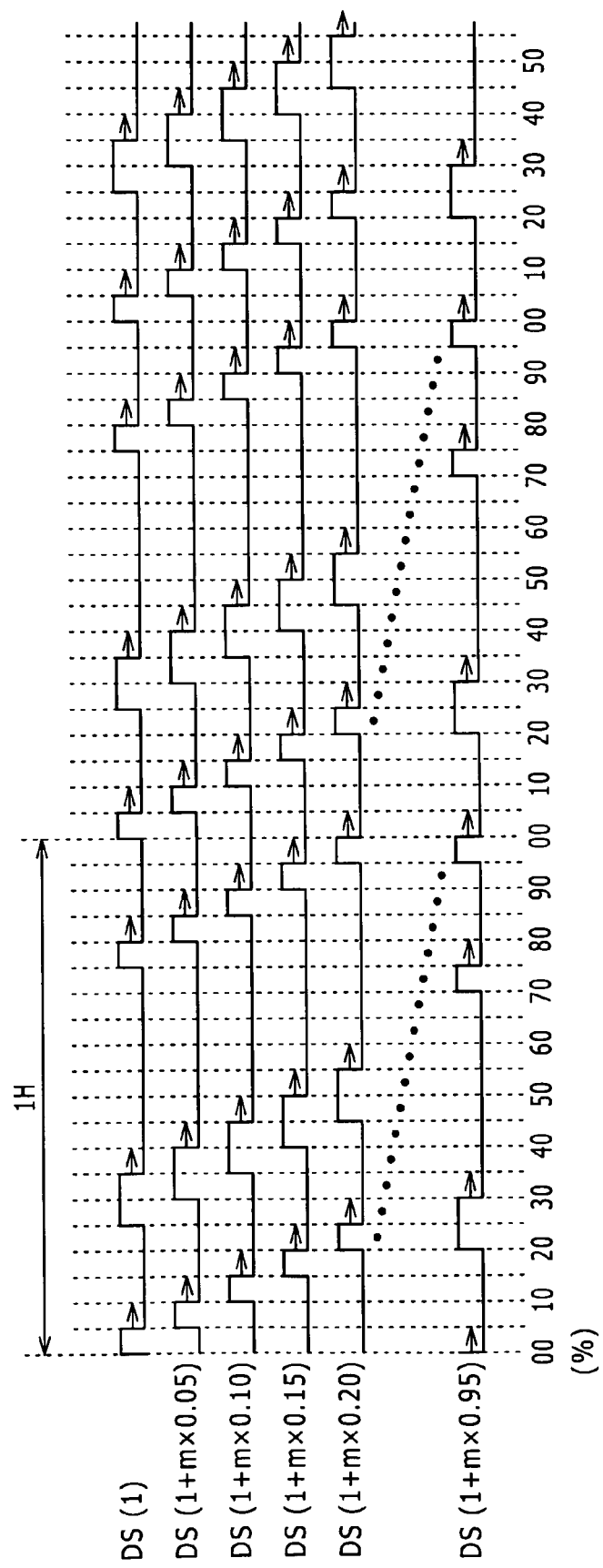
FIGS. 29 and 30 are timing charts illustrating different examples of a driving timing of the organic EL panel of FIG. 17 according to a driving example 5.
Figure 30:
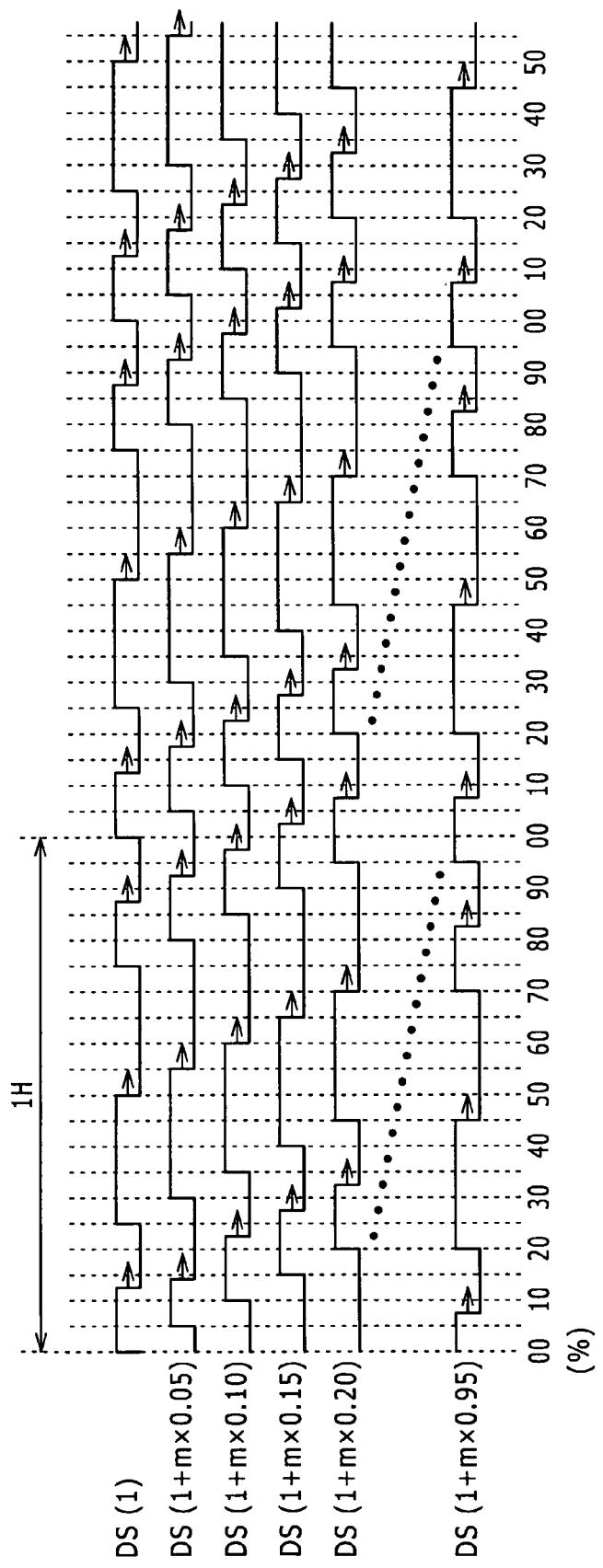

FIGS. 29 and 30 illustrate examples of driving timings of the second scanning line VSCAN2 corresponding to the present driving technique.

It is to be noted that FIG. 29 corresponds to a case wherein the total light emitting period length is comparatively short, but FIG. 30 corresponds to another case wherein the total light emitting period length is comparatively long.

Incidentally, while it is represented also in FIGS. 29 and 30 that the phase relationship makes one cycle with 20 lines similarly as in the driving examples described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, also the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where $0<\mathrm{DUTY}<1$,

First-time light emitting period:

$$[(s-1)/m]\cdot T < t < \{[(s-1)/m]+\mathrm{DUTY}\cdot(1/4)\}\cdot T$$

First-time no-light emitting period:

$$\{[(s-1)/m]+\mathrm{DUTY}\cdot(1/4)\}\cdot T < t < \{[(s-1)/m]+0.25\}\cdot T$$

Second-time light emitting period:

$$\{[(s-1)/m]+0.25\}\cdot T < t < \{[(s-1)/m]+0.25+\mathrm{DUTY}\cdot(2/4)\}\cdot T$$

Second-time no-light emitting period:

$$\{[(s-1)/m]+0.25+\mathrm{DUTY}\cdot(2/4)\}\cdot T < t < \{[(s-1)/m]+0.75\}\cdot T$$

Third-time light emitting period:

$$\{[(s-1)/m]+0.75\}\cdot T < t < \{[(s-1)/m]+0.75+\mathrm{DUTY}\cdot(1/4)\}\cdot T$$

Third-time no-light emitting period:

$$\{[(s-1)/m]+0.75+\mathrm{DUTY}\cdot(1/4)\}\cdot T < t < \{[(s-1)/m]+1\}\cdot T$$

In the case of the present driving example, the total light emitting period length (ratio DUTY) occupying in a one-field period T can be adjusted within the range of 0% to 100% of the one-field period T.

Further, in the case of the present driving example, the distribution ratio of the light emitting time lengths of the light emitting periods is variably controlled so that the second light emitting period may be centered in light mission.

Accordingly, a phenomenon that an image is visually observed triply can be suppressed effectively.

B-6. Driving Example 6 of the Display Panel

According to the driving example 5 described above, a one-field period can be utilized to the utmost for control of the peak luminance level. However, since the variation range of the light emitting period extends over the overall one-field period, there is the possibility that motion artifact may matter.

Therefore, in the present driving example, the maximum value of the total light emitting period length (ratio DUTY) to which the adjustment amount of the peak luminance level is 60% of a one-field period is provided. It is to be noted that, also in the present driving example, the ratio of the length of the first-time light emitting period, second-time light emitting period and third-time light emitting period is set to 1:2:1.

In particular, in the present driving example, 15% are allocated to the first-time light emitting period, 30% to the second-time light emitting period and 15% the third-light emitting period.

Accordingly, in the present driving example, the start timing of the first-time light emitting period is fixed to 0%, the start timing of the second-time light emitting period to 15%, and the start timing of the third-time light emitting period to 45%.

Figure 31:
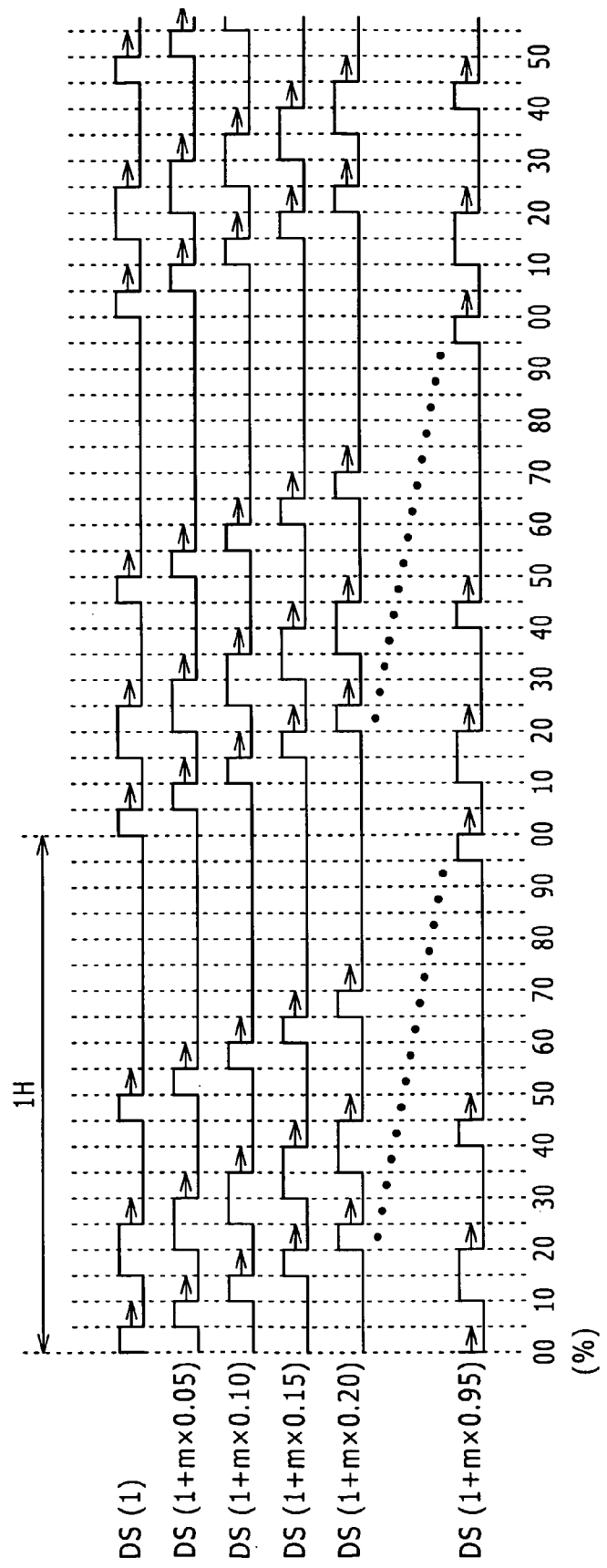
FIGS. 31 and 32 are timing charts illustrating different examples of a driving timing of the organic EL panel of FIG. 17 according to a driving example 6.
Figure 32:
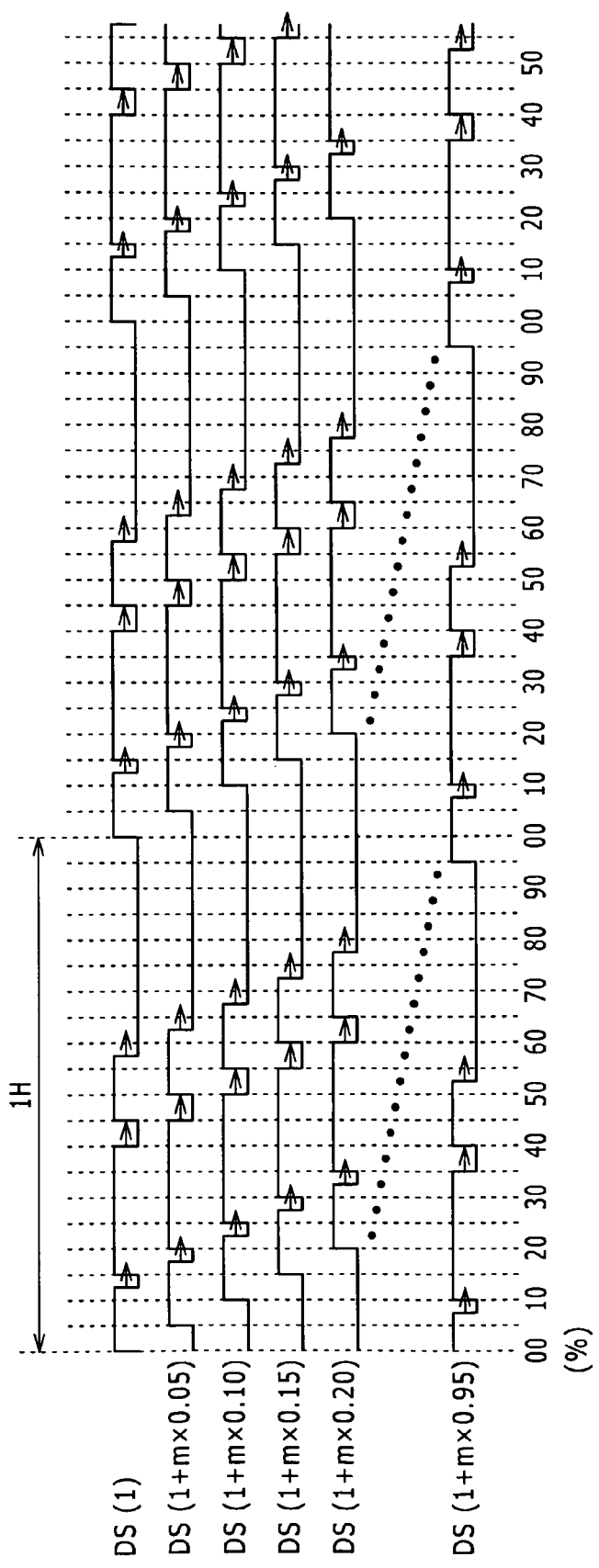

FIGS. 31 and 32 illustrate examples of driving timings of the second scanning line VSCAN2 corresponding to the present driving technique. Both of FIGS. 31 and 32 represent that the start timing of the first-time light emitting period is fixed to 0%, the start timing of the second-time light emitting period to 15%, and the start timing of the third-time light emitting period to 45%. It is to be noted that FIG. 31 corresponds to a case wherein the total light emitting period length is comparatively short, but FIG. 32 corresponds to another case wherein the total light emitting period length is comparatively long.

Incidentally, while it is represented also in FIGS. 31 and 32 that the phase relationship makes one cycle with 20 lines similarly as in the driving examples described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, also the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where $0<\mathrm{DUTY}<0.6$,

First-time light emitting period:

$$[(s-1)/m]\cdot T < t < \{[(s-1)/m]+\mathrm{DUTY}\cdot(1/4)\}\cdot T$$

First-time no-light emitting period:

$$\{[(s-1)/m]+\mathrm{DUTY}\cdot(1/4)\}\cdot T < t < \{[(s-1)/m]+0.15\}\cdot T$$

Second-time light emitting period:

$$\{[(s-1)/m]+0.15\}\cdot T < t < \{[(s-1)/m]+0.15+\mathrm{DUTY}\cdot(2/4)\}\cdot T$$

Second-time no-light emitting period:

$$\{[(s-1)/m]+0.15+\mathrm{DUTY}\cdot(2/4)\}\cdot T < t < \{[(s-1)/m]+0.45\}\cdot T$$

Third-time light emitting period:

$$\{[(s-1)/m]+0.45\}\cdot T < t < \{[(s-1)/m]+0.45+\text{DUTY}\cdot(1/4)\}\cdot T$$

Third-time no-light emitting period:

$$\{[(s-1)/m]+0.45+\text{DUTY}\cdot(1/4)\}\cdot T < t < \{[(s-1)/m]+1\}\cdot T$$

Where the present driving example is adopted, the total light emitting period length (ratio DUTY) occupying in a one-field period T can be adjusted within the range of 0 to 60% of the one-field period T.

From the point of view of motion artifact or flickering, according to the present driving example, the apparent light emitting period can be controlled from 45% to 60%.

Consequently, deterioration of the picture quality can be suppressed from the point of view of both of flickering and motion artifact.

In this manner, where the driving example 6 is used, the peak luminance level can be adjusted over a wide range while deterioration of the picture quality is suppressed.

B-7. Driving Example 7 of the Display Panel

Here, in a driving example 7, the variation technique of the driving example 3 is applied to the light emitting period length of the first and third light emitting periods from among three light emitting periods and the variation technique of the driving example 4 is applied to the light emitting period length of the second light emitting period.

In particular, the start timing of the first light emitting period and the end timing of the third light emitting period are fixed while the other timings are variably controlled, and both of the start and end timings of the second light emitting period are variably controlled with reference to the reference point.

It is to be noted that, also in the present driving example, the maximum value of the total light emitting period length (ratio DUTY) to which the adjustment amount of the peak luminance level is provided is 60% of a one-field period. Further, the ratio of the length of the first-time light emitting period, second-time light emitting period and third-time light emitting period is set to 1:2:1.

In particular, in the present driving example, 15% are allocated to the first-time light emitting period, 30% to the second-time light emitting period and 15% the third-light emitting period.

Accordingly, in the present driving example, the start timing of the first-time light emitting period is fixed to 0%, the base point of the second-time light emitting period to 30%, and the end timing of the third-time light emitting period to 60%.

Figure 33:
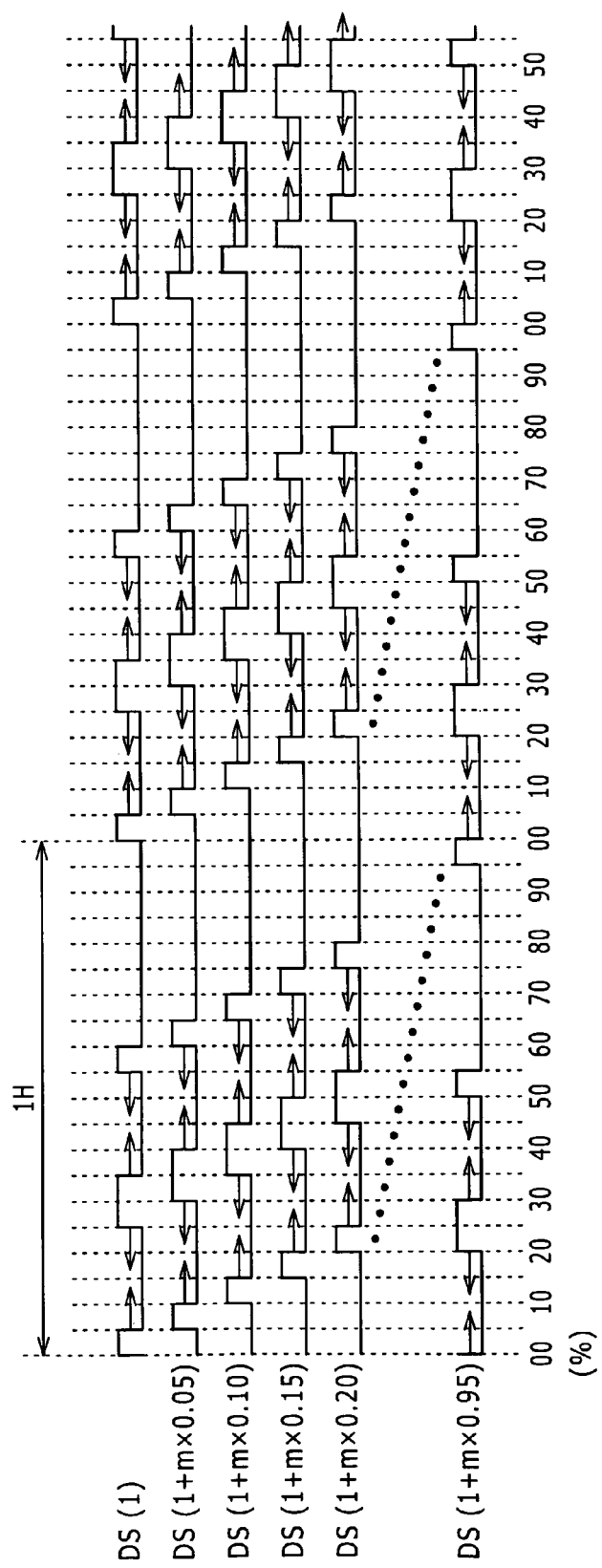
FIGS. 33 and 34 are timing charts illustrating different examples of a driving timing of the organic EL panel of FIG. 17 according to a driving example 7.
Figure 34:
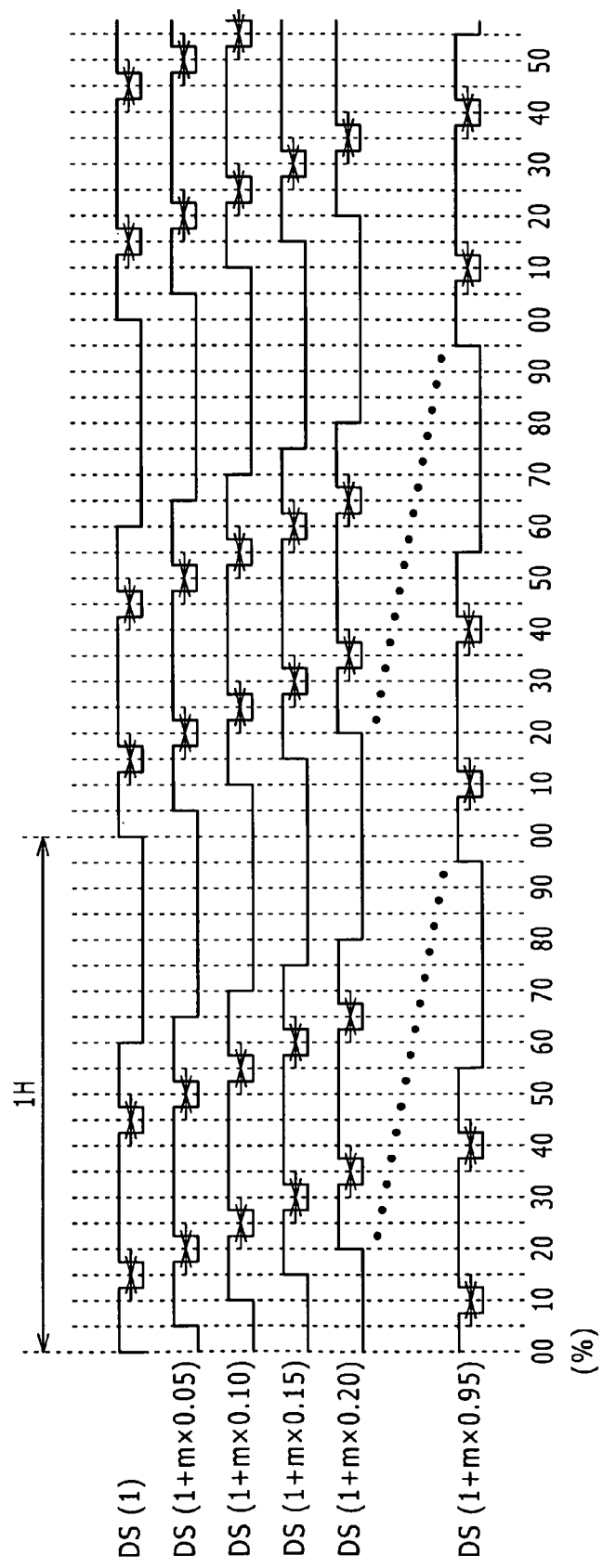

FIGS. 33 and 34 illustrate examples of driving timings of the second scanning line VSCAN2 corresponding to the present driving technique. It is to be noted that FIG. 33 corresponds to a case wherein the total light emitting period length is comparatively short, but FIG. 34 corresponds to another case wherein the total light emitting period length is comparatively long.

Incidentally, while it is represented also in FIGS. 33 and 34 that the phase relationship makes one cycle with 20 lines similarly as in the driving examples described hereinabove, actually the phase relationship is set so as to make one cycle with M lines.

At this time, the light emitting timing determination section 23 determines the light emitting period corresponding to the sth scanning line VSCAN2(s) in accordance with the expression given below.

However, also the following calculation expressions are represented such that a one-field period is given by m horizontal scanning periods. Further, the sth scanning line VSCAN2(s) is represented such that writing operation is carried out within the sth horizontal scanning period and emission of light is started simultaneously.

Further, the ratio of the total light emitting period occupying within a one-field period T is represented by DUTY. It is to be noted that, if a result of the calculation does not become an integral value, then the corresponding timing is adjusted in a unit of a clock.

At this time, the light emitting period and the no-light emitting period are given by the following expressions:

where 0<DUTY<0.6,

First-time light emitting period:

$$[(s-1)/m]\cdot T < t < \{[(s-1)/m]+\text{DUTY}\cdot(1/4)\}T$$

First-time no-light emitting period:

$$\{[(s-1)/m]+\text{DUTY}\cdot(1/4)\}\cdot T < t < \{[(s-1)/m]+0.3-\text{DUTY}\cdot(1/4)\}\cdot T$$

Second-time light emitting period:

$$\{[(s-1)/m]+0.3-\text{DUTY}\cdot(1/4)\}\cdot T < t < \{[(s-1)/m]+0.3+\text{DUTY}\cdot(1/4)\}\cdot T$$

Second-time no-light emitting period:

$$\{[(s-1)/m]+0.3+\text{DUTY}\cdot(1/4)\}\cdot T < t < \{[(s-1)/m]+0.6-\text{DUTY}\cdot(1/4)\}\cdot T$$

Third-time light emitting period:

$$\{[(s-1)/m]+0.6-\text{DUTY}\cdot(1/4)\}\cdot T < t < \{[(s-1)/m]+0.6\}\cdot T$$

Third-time no-light emitting period:

$$\{[(s-1)/m]+0.6\}\cdot T < t < \{[(s-1)/m]+1\}\cdot T$$

Where the present driving example is adopted, the total light emitting period length (ratio DUTY) occupying in a one-field period T can be adjusted within the range of 0% to 60% of the one-field period T.

From the point of view of motion artifact or flickering, according to the present driving example, the apparent light emitting period can be controlled to 60%.

Consequently, deterioration of the picture quality can be suppressed from the point of view of both of flickering and motion artifact.

In this manner, where the driving example 7 is used, the peak luminance level can be adjusted over a wide range while deterioration of the picture quality is suppressed.

C. Other Embodiments

C-1. Relative Ratio Between the Light Emitting Period Lengths

In the driving examples described hereinabove, the ratio between the light emitting period having the longest light emitting period length and the light emitting period having the shortest light emitting period length is 3:1 or 2:1.

However, the ratio between the light emitting periods may be different from the specific ratios. It is to be noted that, in order to allow one light emitting period to be visually observed principally from among a plurality of light emitting periods, preferably the ratio between light emitting period lengths is equal to or higher than 1.5:1.

C-2. Control of the Adjustment Step

In the driving examples described hereinabove, one field period includes two light emitting periods and the length of one of the light emitting periods is varied in a unit of one adjustment step.

Naturally, also where the number of light emitting periods within one field period is three or more, the length of only one of the light emitting periods may be variably controlled in a unit of one adjustment step similarly.

It is to be noted that, while the adjustment step width becomes greater than one adjustment step, if the number of light emitting periods whose length is to be varied one by one adjustment step is N−1, then the adjustment step width can be reduced from that where the length of all of N light emitting periods is varied one by one adjustment step. Consequently, it is possible to increase the adjustment step number of the peak luminance and reduce the adjustment step width to make the luminance variation smooth.

C-3. Product Example a. Drive IC

In the foregoing description, a pixel array section and a driving circuit are formed on one panel.

However, it is possible to produce and distribute the pixel array section 3 and the scanning line driving sections 5, 7, 9, 23 or the like separately from each other. For example, it is possible to fabricate the scanning line driving sections 5, 7, 9, 23 or the like as an independent drive IC (integrated circuit) and distribute the same independently of a panel on which the pixel array section 3 is formed.

b. Display Module

Figure 35:
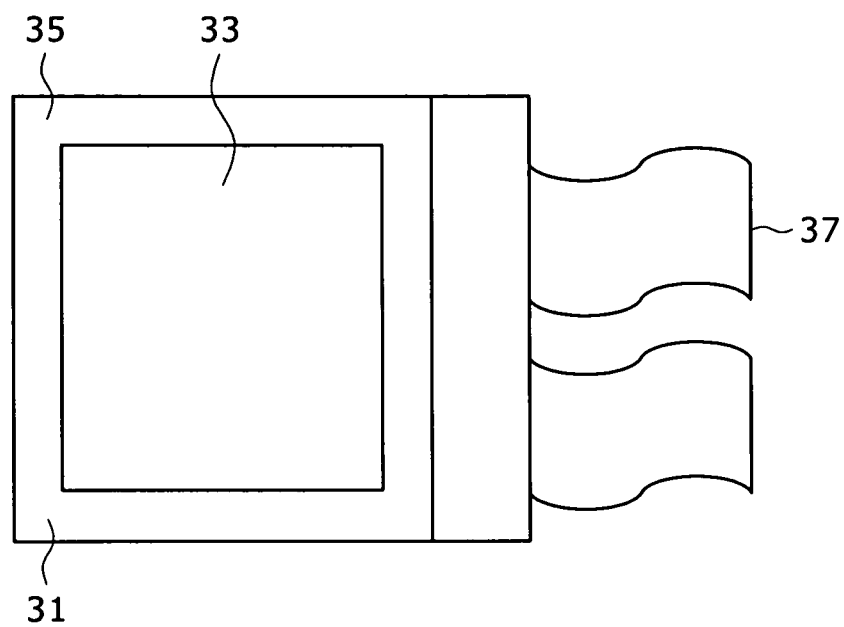
FIG. 35 is a schematic view showing an example of a configuration of a display module.

The organic EL panel 21 in the embodiment described above may be distributed in the form of a display module 31 having an appearance configuration shown in FIG. 35.

The display module 31 has a structure wherein an opposing section 33 adhered to the surface of a support board 35. The opposing section 33 includes a substrate formed from a transparent member of glass or the like and has a color filter, a protective film, a light blocking film and so forth disposed on the surface thereof.

It is to be noted that a flexible printed circuit (FPC) 37 for inputting and outputting a signal from the outside to the support board 35 and vice versa and other necessary elements may be provided on the display module 31.

c. Electronic Apparatus

The organic EL panel in the embodiments described hereinabove is circulated also in the form of a commodity wherein the organic EL panel is incorporated in an electronic apparatus.

Figure 36:
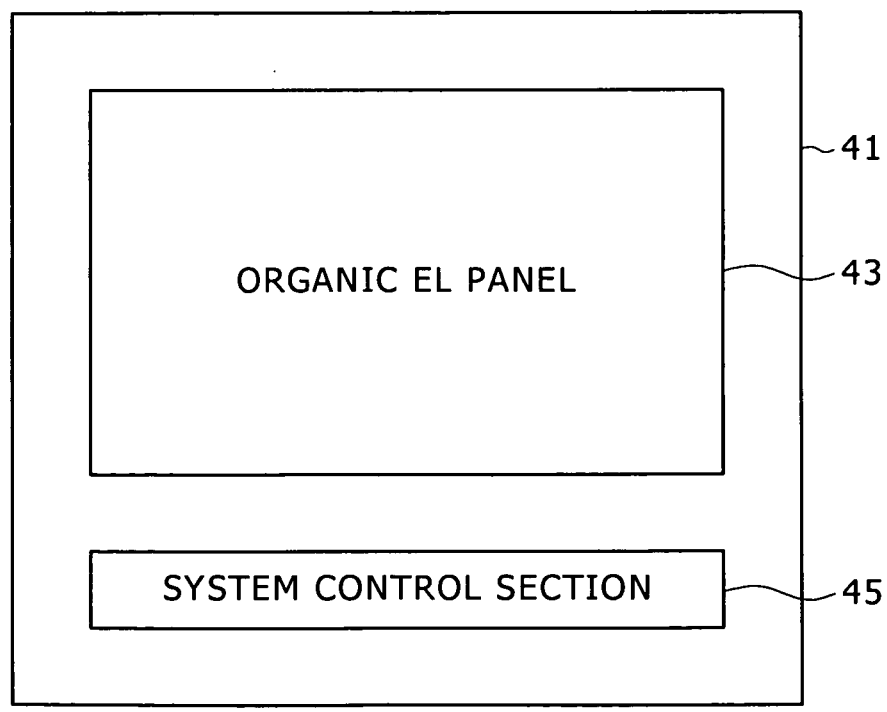
FIG. 36 is a schematic view showing an example of a function configuration of an electronic apparatus.

FIG. 36 shows an example of a configuration of an electronic apparatus 41. Referring to FIG. 36, the electronic apparatus 41 includes an organic EL panel 43, which may be any of the organic EL panels described hereinabove, and a system control block 45. The substance of processing executed by the system control block 45 depends upon the form of the commodity of the electronic apparatus 41.

It is to be noted that the electronic apparatus 41 is not restricted to apparatus of a particular field as long as it incorporates a function of displaying an image produced in the electronic apparatus 41 or inputted from the outside.

Figure 37:
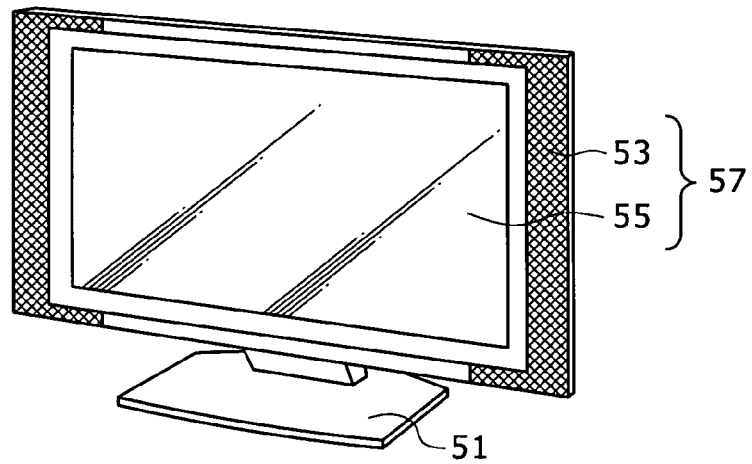
FIGS. 37, 38A and 38B, 39, 40A and 40B, and 41 are schematic views showing different examples of a commodity as an electronic apparatus.

The electronic apparatus 41 of the type described may be, for example, a television receiver. An example of an appearance of a television receiver 51 is shown in FIG. 37.

A display screen 57 formed from a front panel 53, a filter glass plate 55 and so forth is disposed on the front face of a housing of the television receiver 51. The display screen 57 corresponds to the organic EL panel described hereinabove in connection with the embodiment.

Figure 38A:
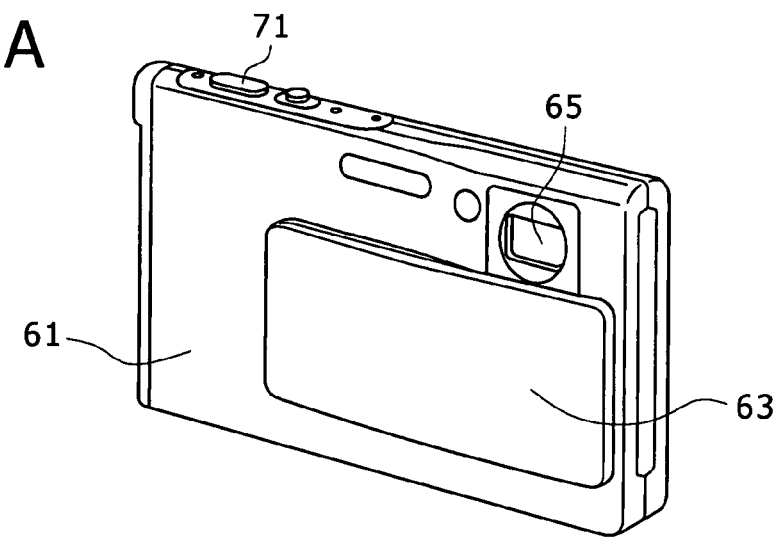
Figure 38B:
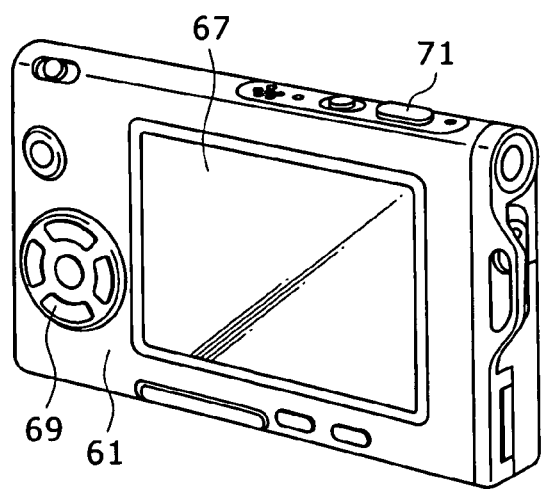

Or, the electronic apparatus 41 may be, for example, a digital camera. An example of an appearance of a digital camera 61 is shown in FIGS. 38A and 38B. FIG. 38A shows an example of an appearance of the digital camera 61 on the front face side, that is, on the image pickup object side, and FIG. 38B shows an example of an appearance of the digital camera 61 on the rear face side, that is, on the image pickup person side.

The digital camera 61 includes an image pickup lens not shown disposed on the rear face side of a protective cover 63 which is in a closed state in FIG. 38A. The digital camera 61 further includes a flash light emitting block 65, a display screen 67, a control switch 69 and a shutter button 71. The display screen 67 corresponds to the organic EL panel described hereinabove in connection with the embodiment.

Figure 39:
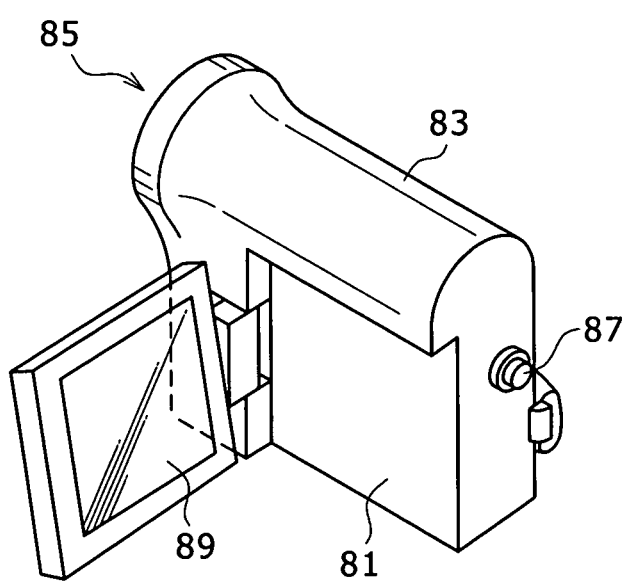

Or else, the electronic apparatus 41 may be, for example, a video camera. FIG. 39 shows an example of an appearance of a video camera 81.

Referring to FIG. 39, the video camera 81 shown includes an image pickup lens 85 provided at a front portion of a body 83 for picking up an image of an image pickup object, an image pickup start/stop switch 87, and a display screen 89. The display screen 89 corresponds to the organic EL panel described hereinabove in connection with the embodiment.

Figure 40A:
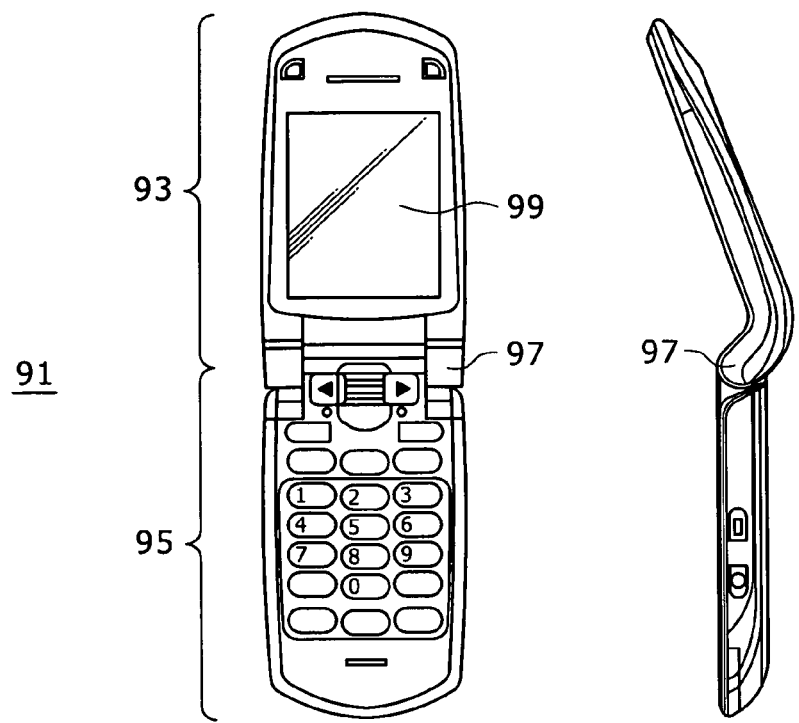
Figure 40B:
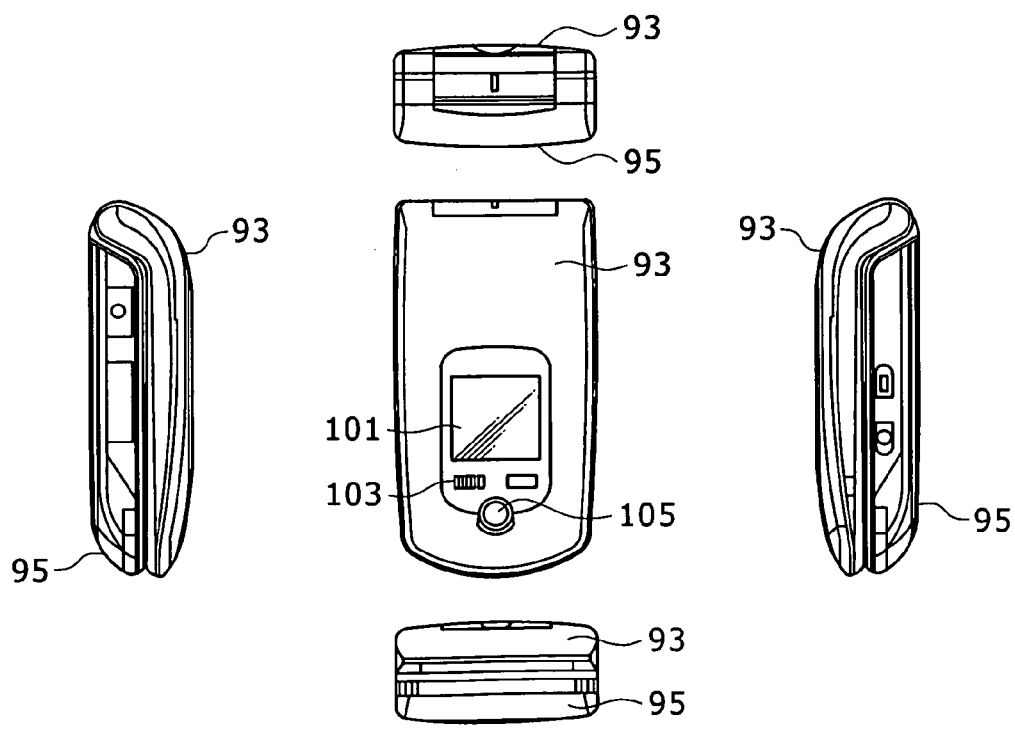

Or otherwise, the electronic apparatus 41 may be, for example, a portable terminal apparatus. FIGS. 40A and 40B show an example of an appearance of a portable telephone set 91 as a portable terminal apparatus. Referring to FIGS. 40A and 40B, the portable telephone set 91 shown is of the foldable type, and FIG. 40A shows the portable telephone set 91 in an unfolded state and FIG. 40B shows the portable telephone set 91 in a folded state.

The portable telephone set 91 includes an upper side housing 93, a lower side housing 95, a connection portion 97 in the form of a hinge, a display screen 99, an auxiliary display screen 101, a picture light 103 and an image pickup lens 105. The display screen 99 and the auxiliary display screen 101 correspond to the organic EL panel described hereinabove in connection with the embodiment.

Figure 41:
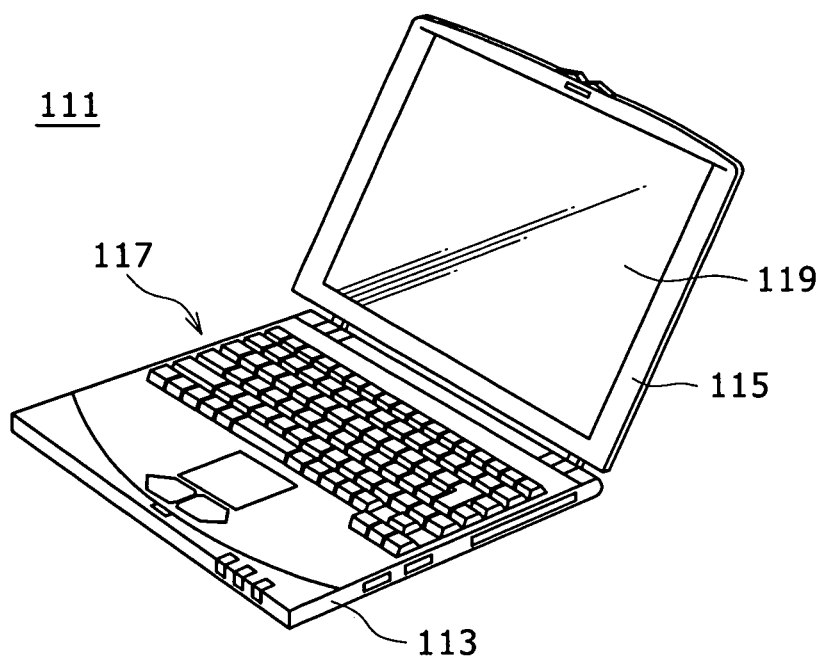

Furthermore, the electronic apparatus 41 may be, for example, a computer. FIG. 41 shows an example of an appearance of a notebook type computer 111.

The notebook type computer 111 includes a lower side housing 113, an upper side housing 115, a keyboard 117 and a display screen 119. The display screen 119 corresponds to the organic EL panel described hereinabove in connection with the embodiment.

The electronic apparatus 41 may further be formed as an audio reproduction apparatus, a game machine, an electronic book, an electronic dictionary or the like.

C-4. Other Examples of the Display Device

The driving methods described hereinabove may be applied also to other apparatus than organic EL panels. For example, the driving methods may be applied, for example, to inorganic EL panels, display panels on which LEDs are arrayed, and display panels of the self-luminous type wherein light emitting elements having other diode structures are arrayed on the surface.

Further, the driving methods described hereinabove may be applied also to display panels of the non-self-luminous type such as liquid crystal display panels.

C-5. Other Examples of the Pixel Circuit

Figure 1:
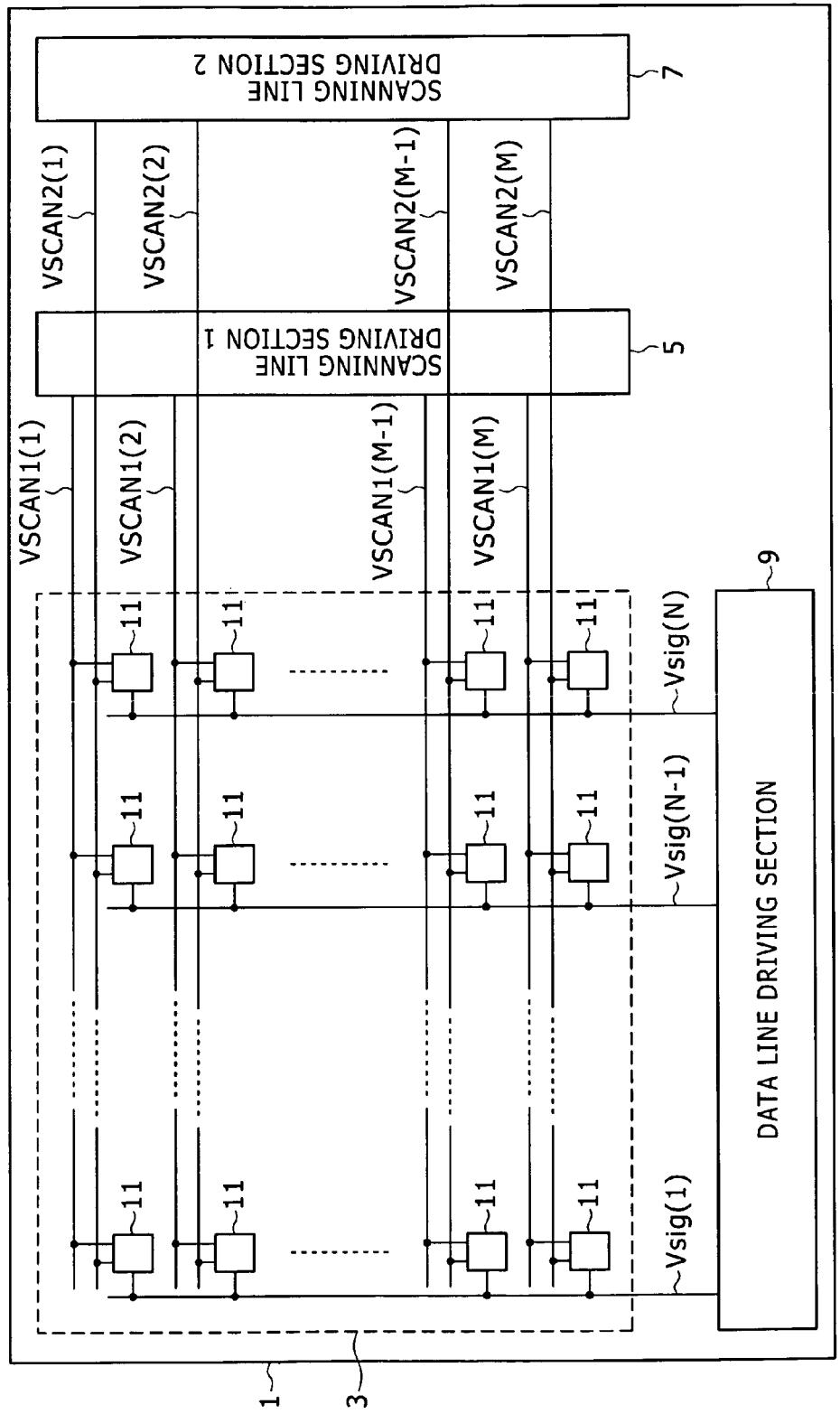
FIG. 1 is a circuit diagram showing an example of a general configuration of an organic EL panel in related art.
Figure 2:
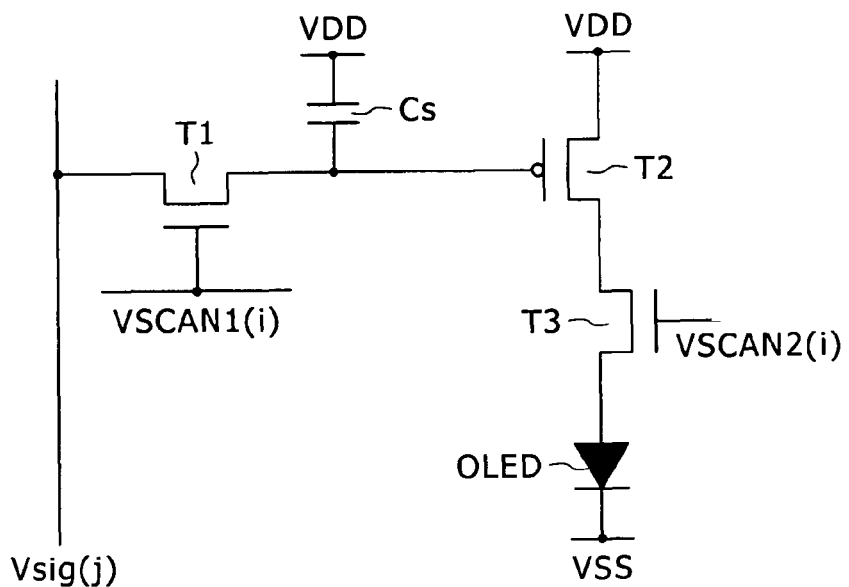
FIGS. 2 and 3 are circuit diagrams showing different examples of a pixel circuit of the active matrix driving type.
Figure 3:
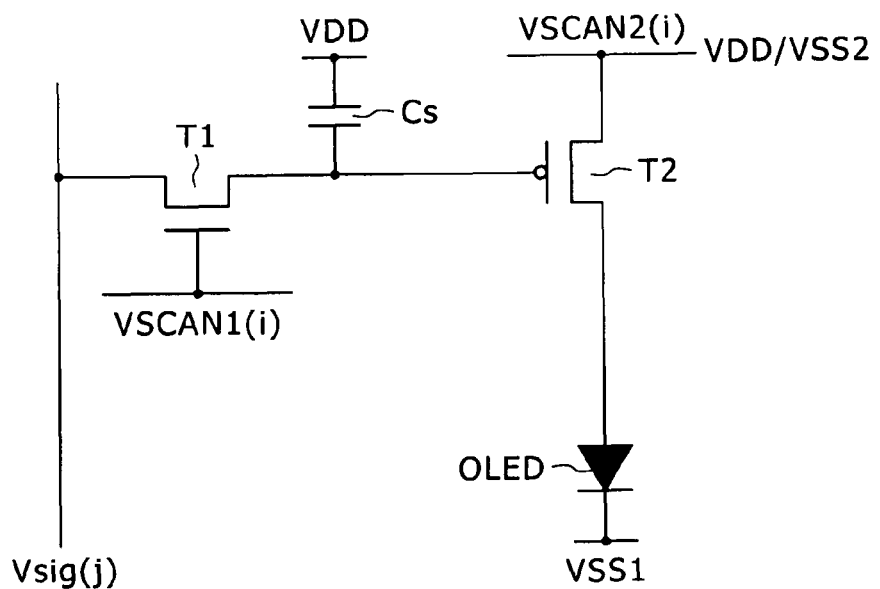
Figure 4:
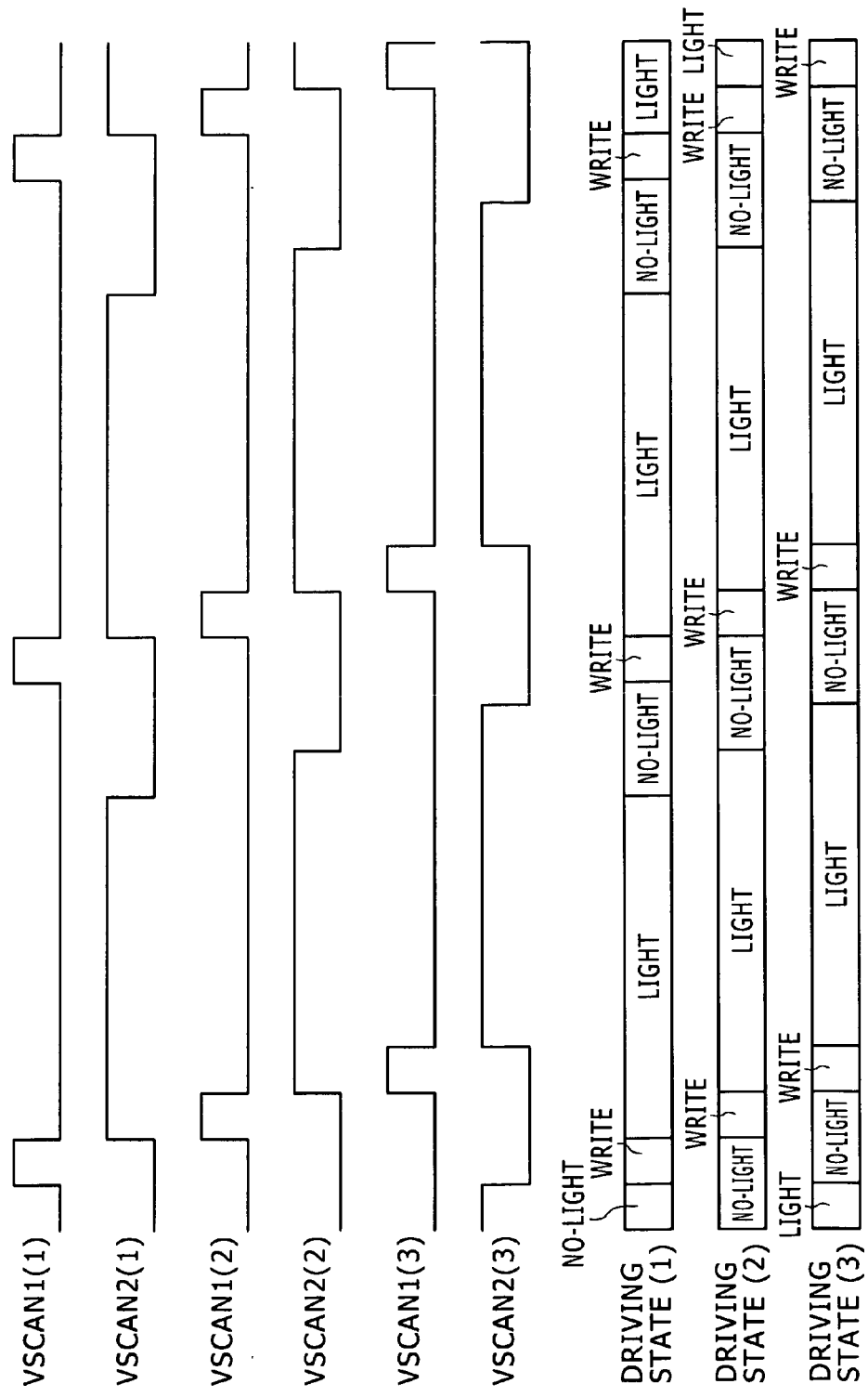
FIGS. 4 and 5 are timing charts illustrating different examples of driving operation of the organic EL panel in related art which includes one light emitting period.
Figure 5:
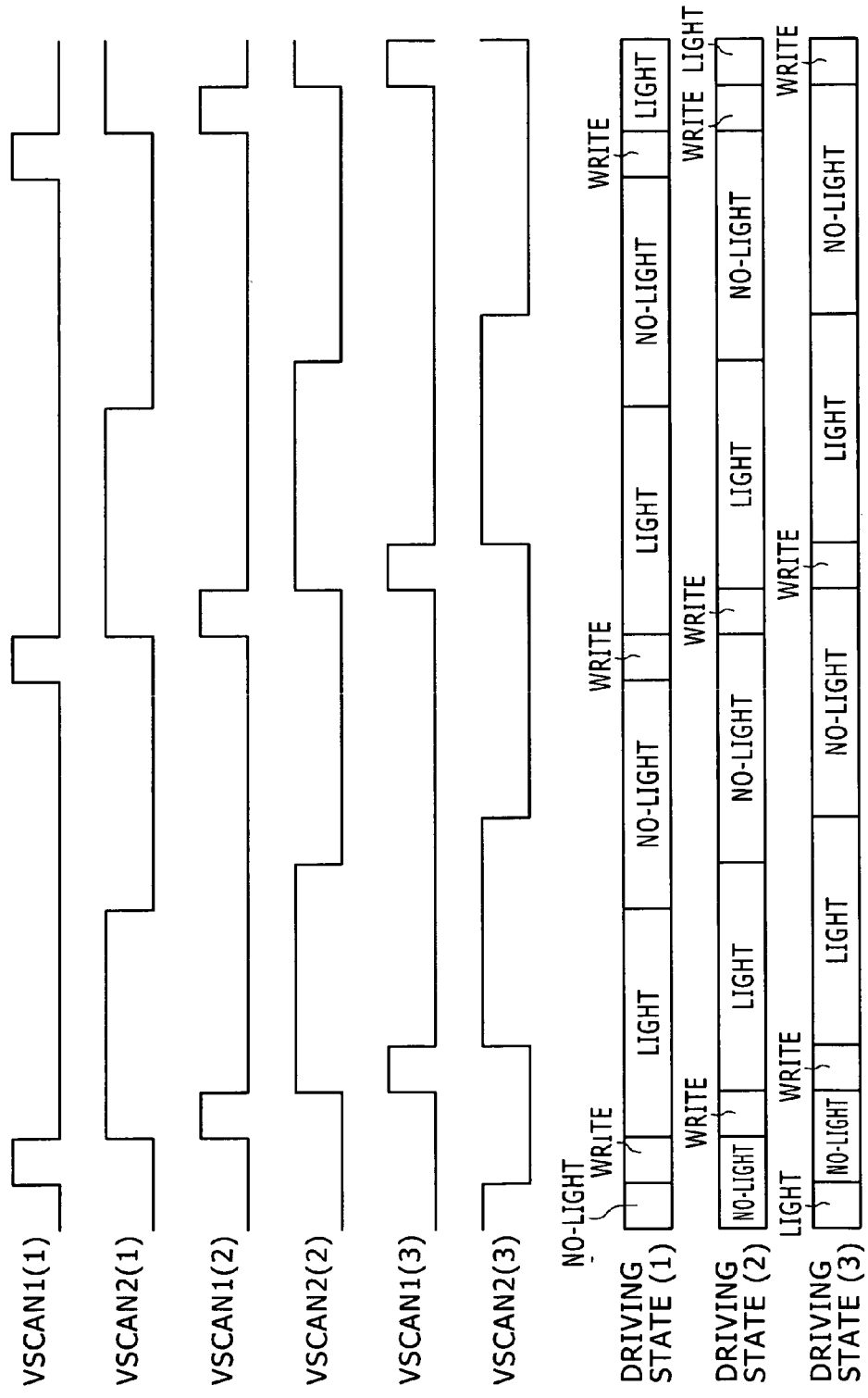
Figure 6:
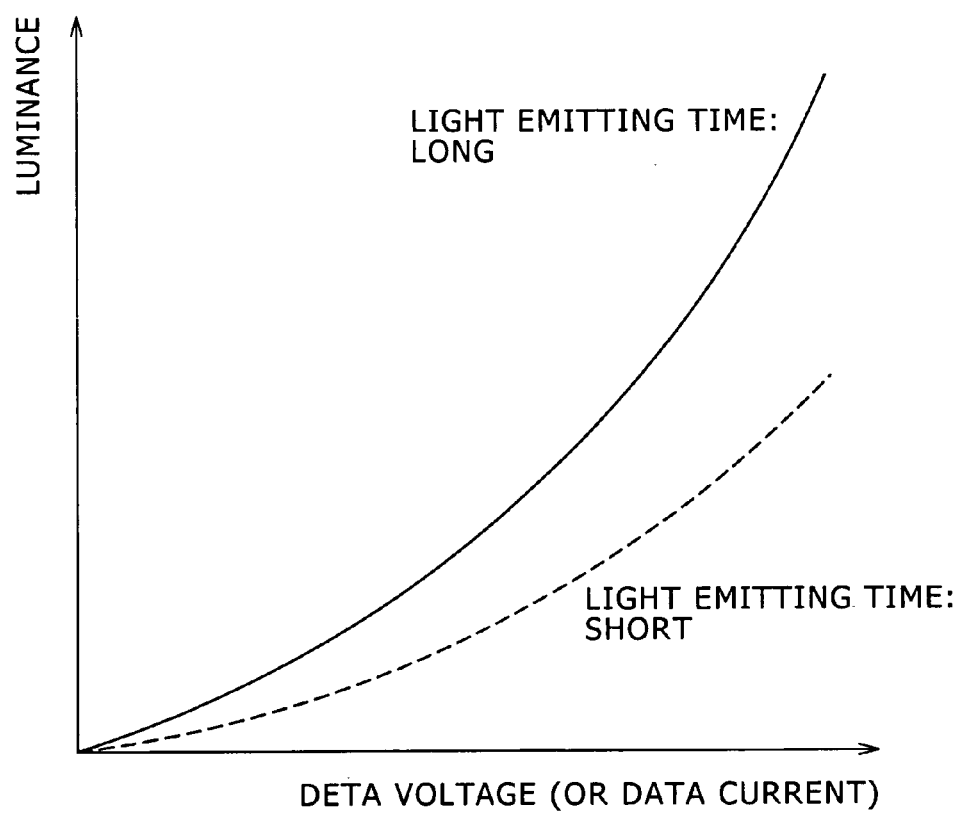
FIG. 6 is a diagram illustrating a relationship between a light emitting period length and a peak luminance level.
Figure 7:
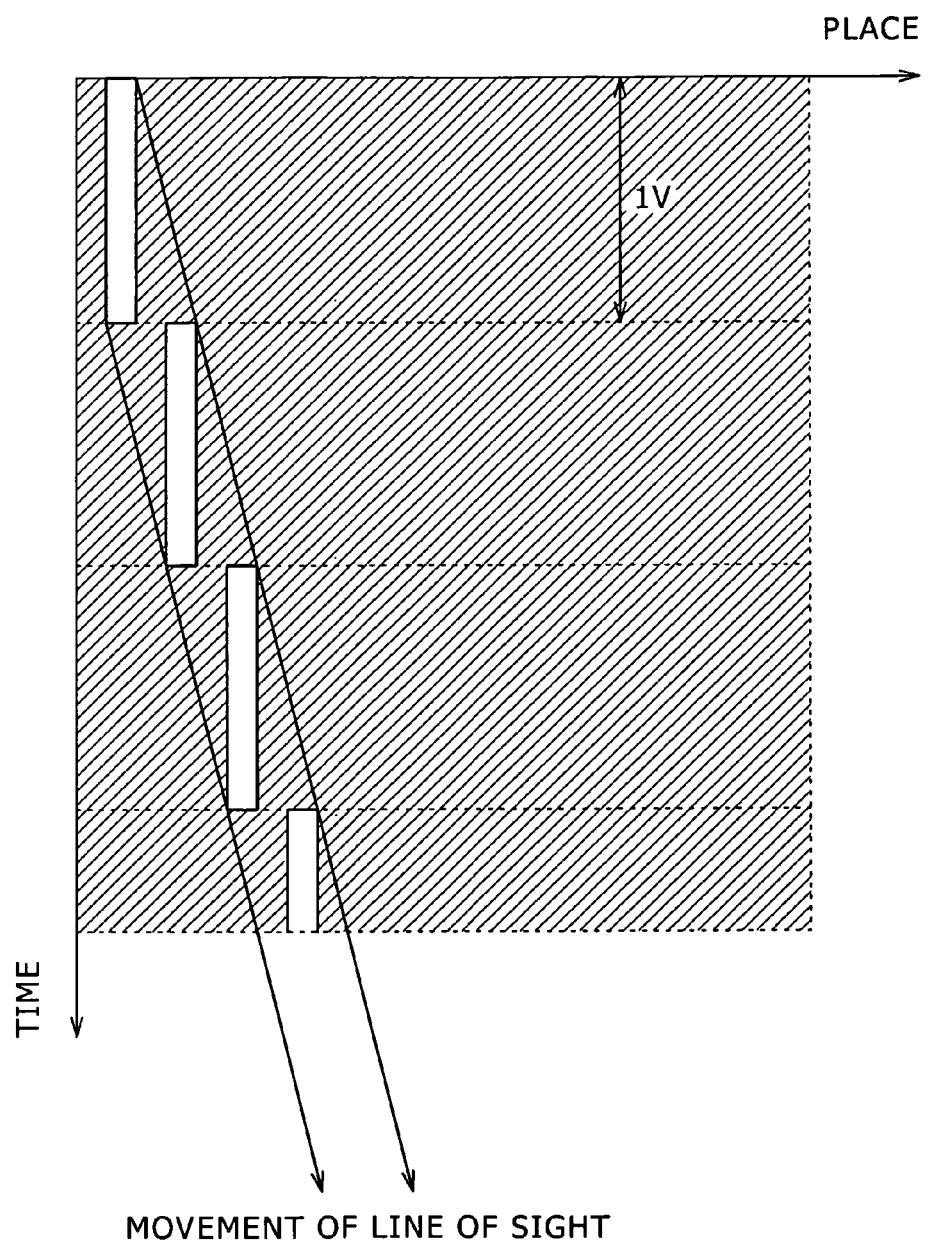
FIGS. 7 to 9 are diagrammatic views illustrating different relationships between the light emitting period length and the movement of the line of sight.
Figure 8:
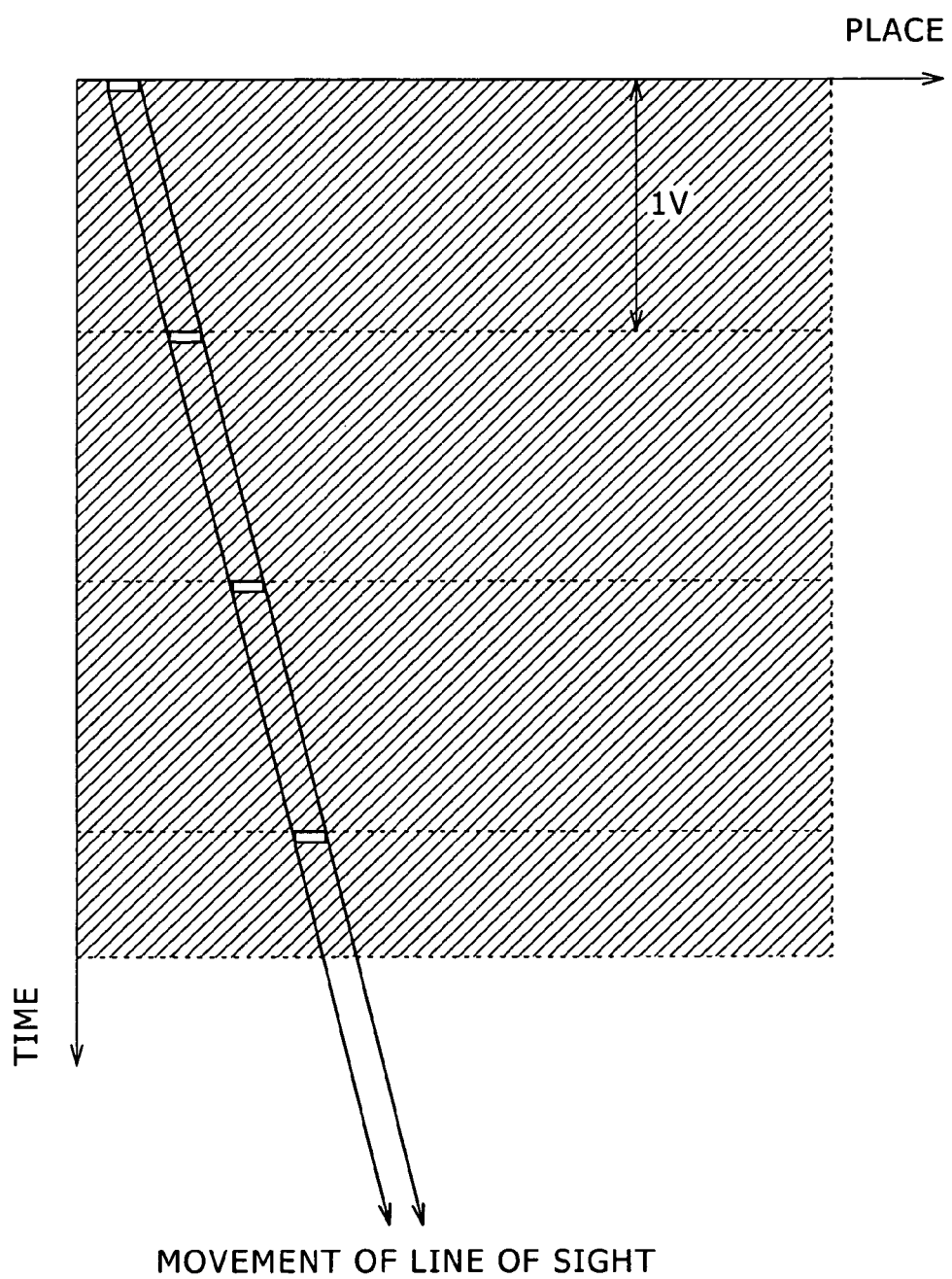
Figure 9:
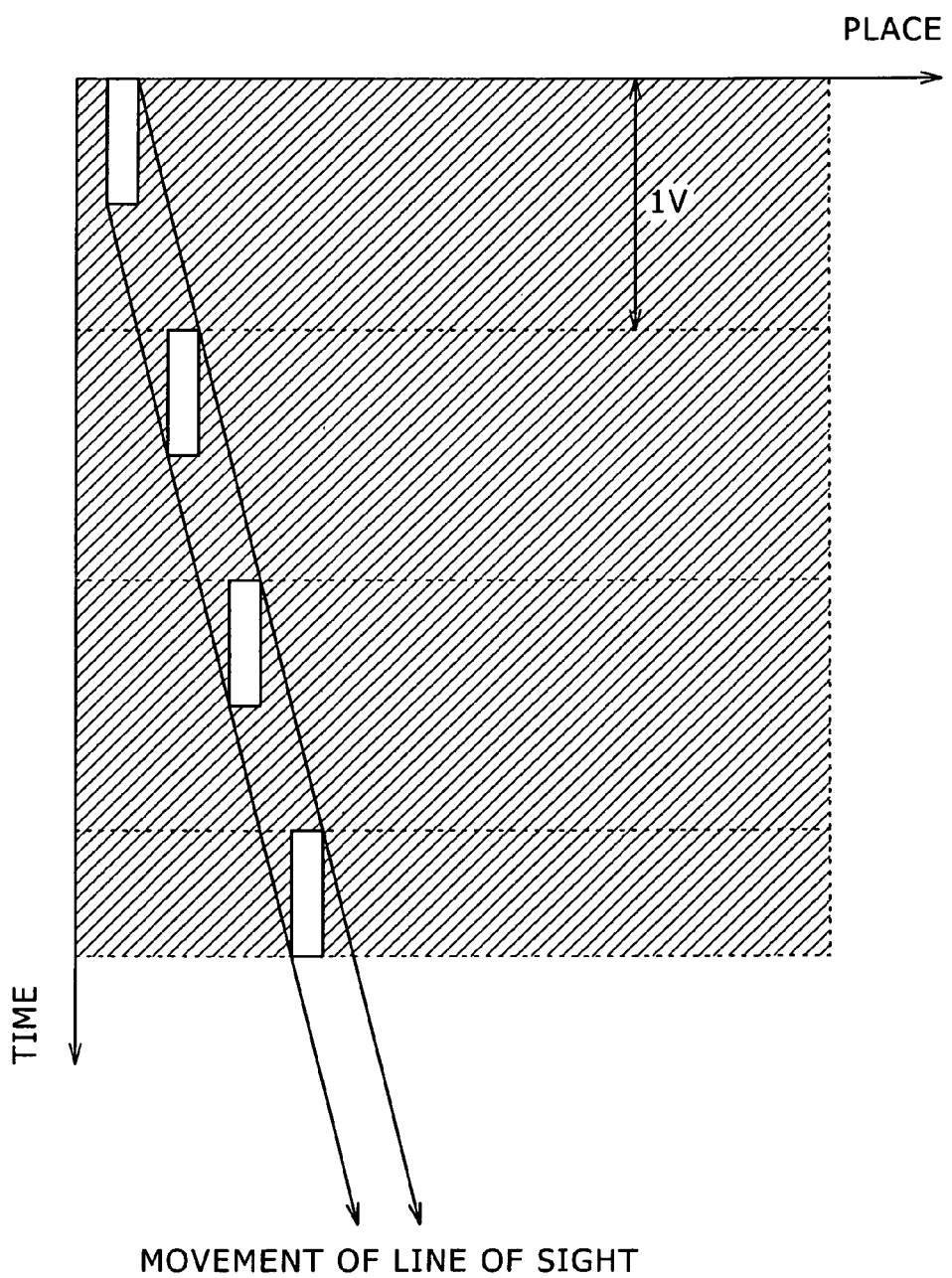
Figure 10:
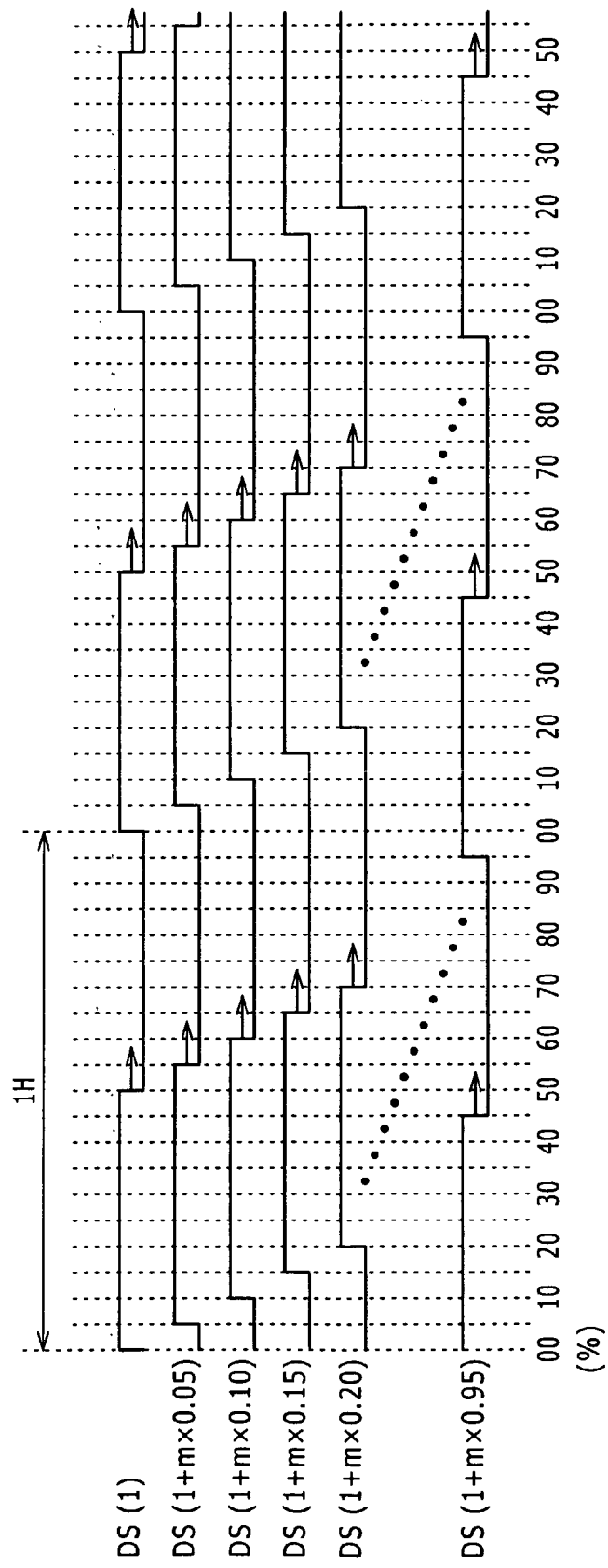
FIGS. 10 and 11 are timing charts illustrating different examples of driving timings where the light emitting period lengths of 50% and 20% are provided by one light emitting period, respectively, in the organic EL panel in related art.
Figure 11:
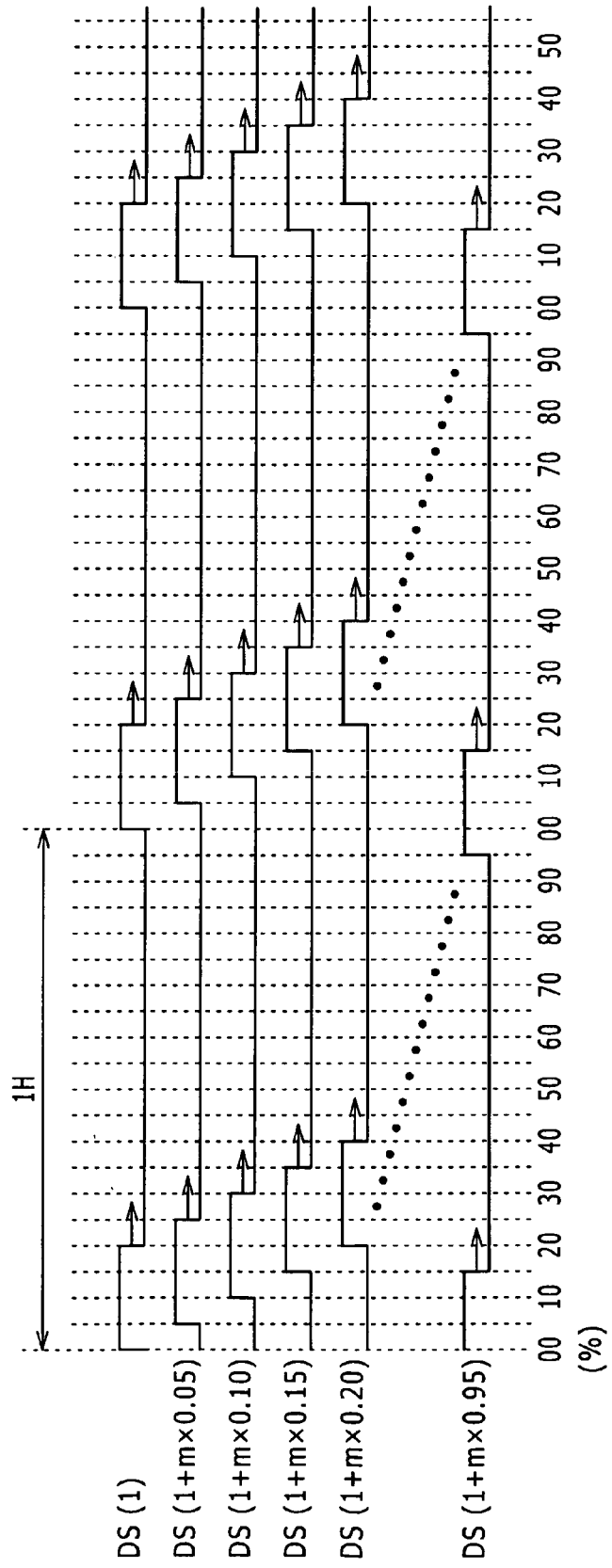
Figure 12:
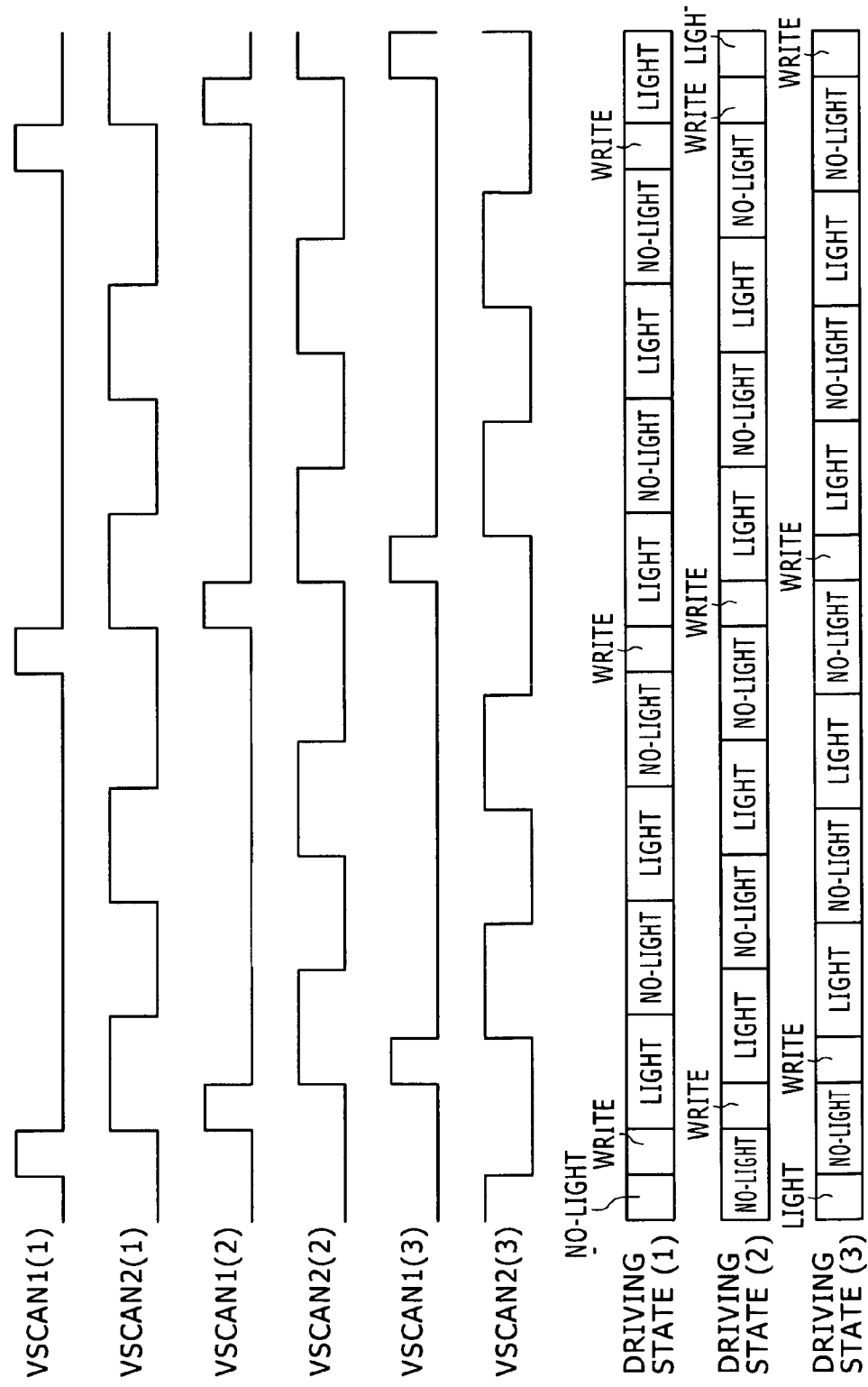
FIGS. 12 and 13 are timing charts illustrating different examples of driving operation of the organic EL panel in related art which include two light emitting periods.
Figure 13:
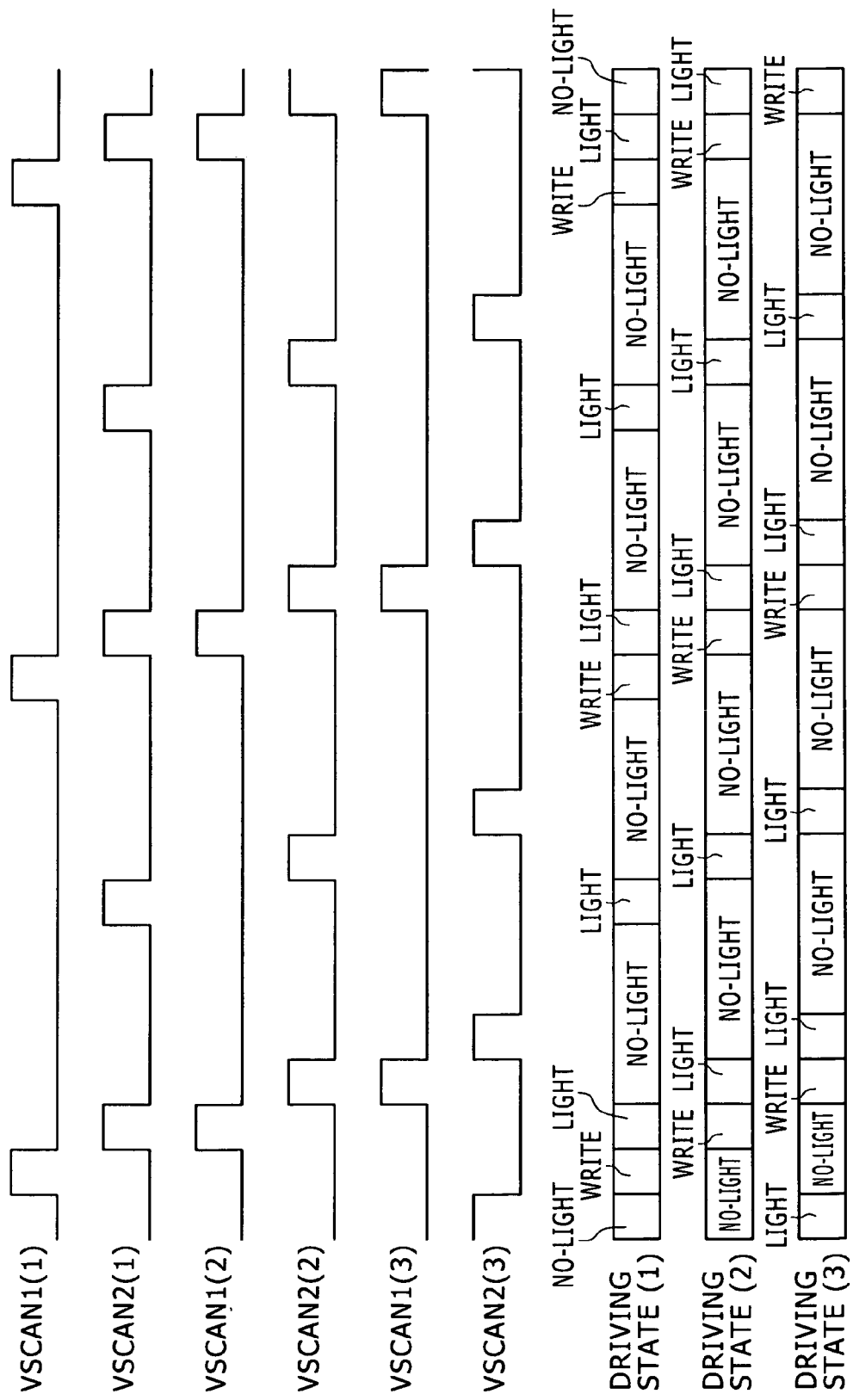
Figure 14:
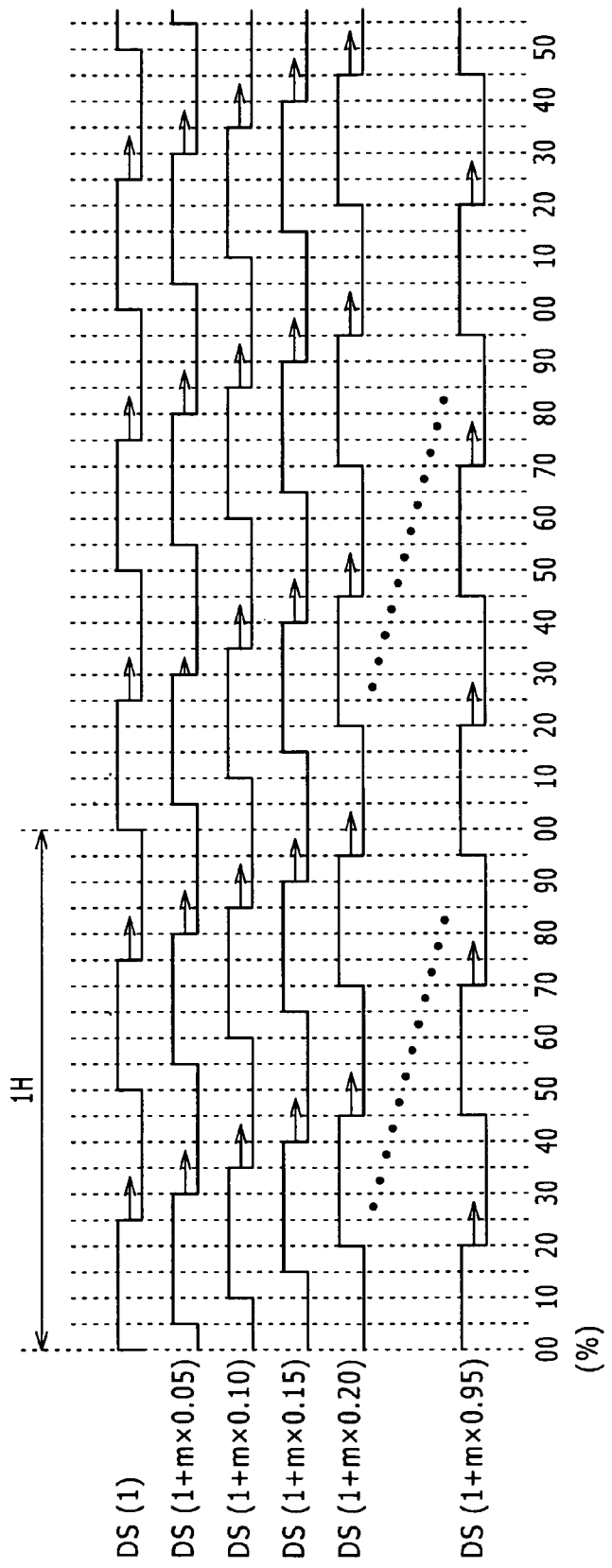
FIGS. 14 and 15 are timing charts illustrating different examples of driving timings where the light emitting period lengths of 50% and 20% are provided by two light emitting periods, respectively, in the organic EL panel in related art.
Figure 15:
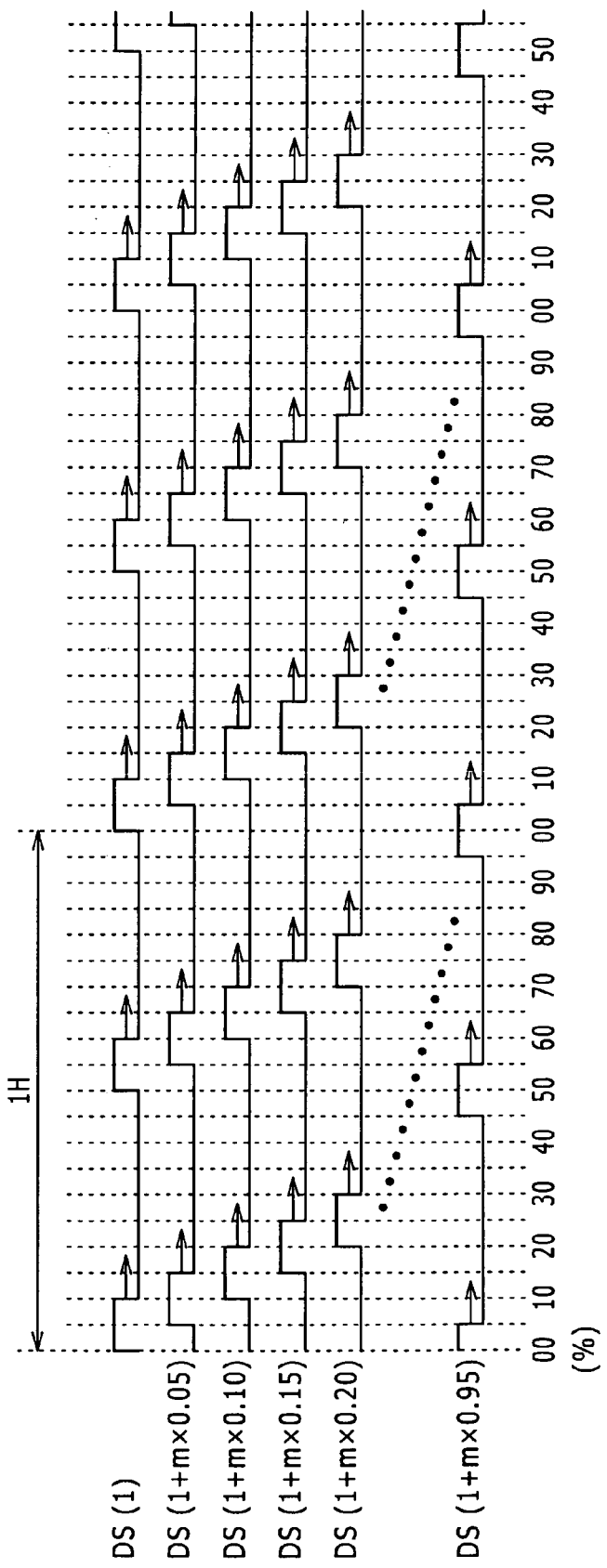
Figure 16:
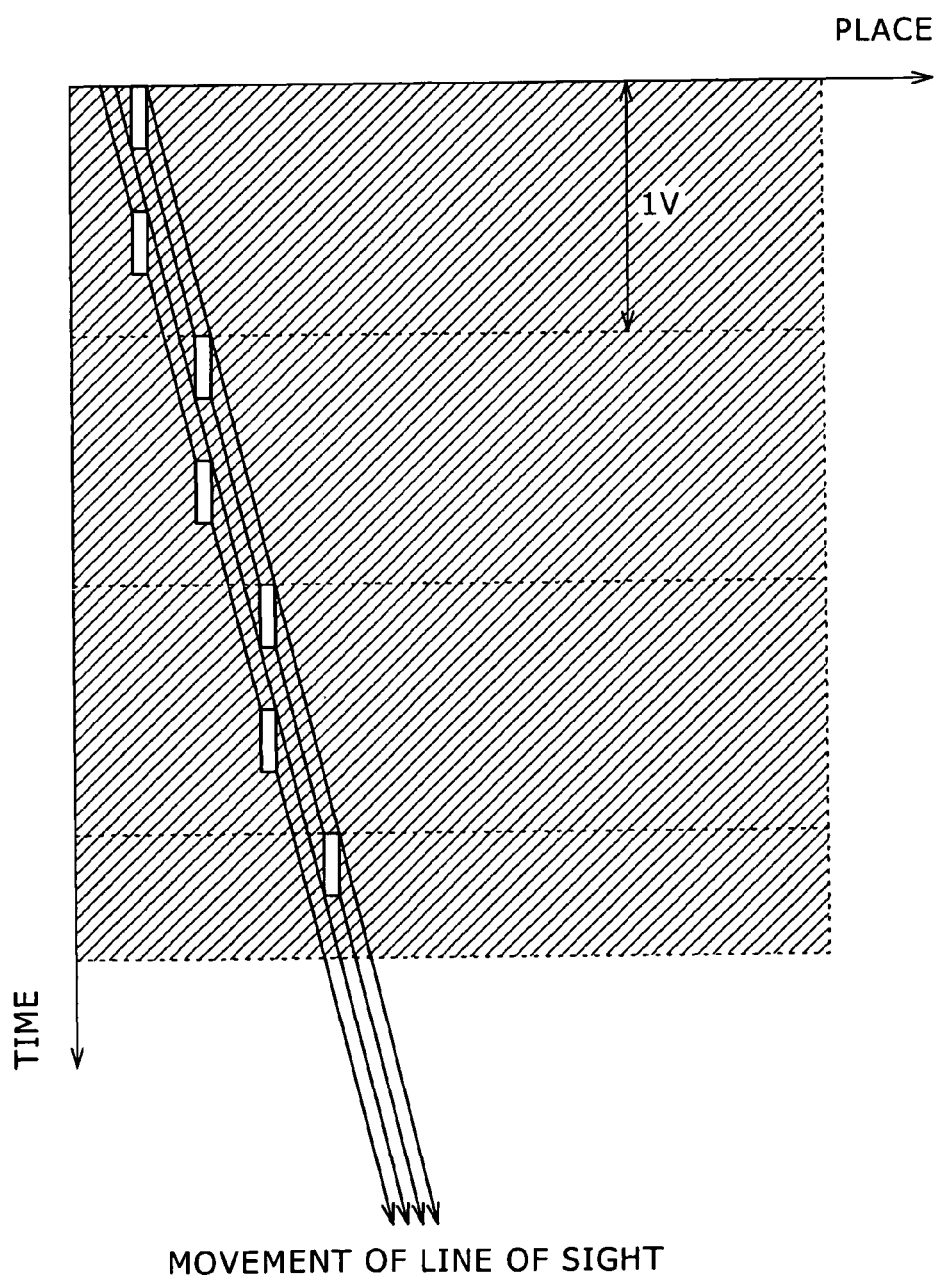
FIG. 16 is a diagrammatic view illustrating a relationship between the light emitting period length and the movement of a line of sight in the organic EL panel in related art.

In the foregoing description, an example of a pixel circuit of the active matrix driving type is described with reference to FIGS. 2 and 3.

However, the configuration of the pixel circuit is not limited to this, but the present invention can be applied also to existing pixel circuits and pixel circuits of various configurations which may be proposed in the future.

The embodiments described hereinabove may be modified in various manners within the spirit and scope of the present invention. Further, various modifications and applications may be made by some operation or combination based on the disclosure of the present invention.

What is claimed is:

1. A display panel driving method of the type wherein the total light emitting period length within each of a plurality of one-field periods is controlled to variably control the peak luminance level of a display panel, said driving method comprising:

variably controlling, for a first one-field period that has N light emitting periods per writing period disposed therein, N being equal to or greater than 2, the light emitting period length of a first particular one of the light emitting periods and the other light emitting period or periods to provide a difference in luminance between the first particular light emitting period and the other light emitting period or periods so that the first particular light emitting period is visually observable, and variably controlling, for a second one-field period that has N light emitting periods per writing period disposed therein, N being equal to or greater than 2, the light emitting period length of a second particular one of the light emitting periods and the other light emitting period or periods to provide a difference in luminance between the second particular light emitting period and the other light emitting period or periods so that the second particular light emitting period is visually observable, wherein the first particular light emitting period and the second particular light emitting period have different lengths.

2. The display panel driving method according to claim 1, wherein the ratio between a maximum value and a minimum value of the light emitting period length allocated to the individual light emitting periods is equal to or higher than 1.5:1.

3. The display panel driving method according to claim 1, wherein a ratio of the length of the particular light emitting period and the length of the other light emitting period is equal to or higher than 3:1.

4. The display panel driving method according to claim 1, wherein out of N light emitting periods per writing period, equal to or less than N−1 light emitting periods are controlled to have varied length.

5. The display panel driving method according to claim 1, wherein the light emitting period length is controlled by variable control of an end timing of the ith light emitting period and a start timing of the i+1th light emitting period, i being an odd number which satisfies $1 \le i \le N-1$ while i+1 satisfies $2 \le i+1 \le N$.

6. The display panel driving method according to claim 1, wherein the light emitting period length is controlled by variable control of an end timing of the ith light emitting period and a start timing and an end timing of the i+1th light emitting period, i being an odd number which satisfies $1 \le i \le N-1$ while i+1 satisfies $2 \le i+1 \le N$.

7. The display panel driving method according to claim 1, wherein the period length from a start timing of the first-time light emitting period to an end timing of the Nth-time light emitting period is equal to or higher than 25% but equal to or lower than 75% of a one-field period length.

8. The display panel driving method according to claim 1, wherein a start timing of the first-time light emitting period and an end timing of the Nth-time light emitting period are fixed.

9. The display panel driving method according to claim 1, wherein the period length from a start timing of the first-time light emitting period to an end timing of the Nth-time light emitting period is at least 80% of a one-field period length.

10. The display panel driving method according to claim 1, wherein the period length from a start timing of the first-time light emitting period to an end timing of the Nth-time light emitting period is at least 85% of a one-field period length.

11. A display apparatus, comprising:

a display panel having a pixel structure configured for active matrix driving; and a display panel driving section configured to control the total light emitting period length within each of a plurality of one-field periods to variably control the peak luminance level of said display panel, said display panel driving section variably controlling, for a first one-field period that has N light emitting periods per writing period disposed therein, N being equal to or greater than 2, the light emitting period length of a first particular one of the light emitting periods and the other light emitting period or periods to provide a difference in luminance between the first particular light emitting period and the other light emitting period or periods so that the first particular light emitting period is visually observable, and variably controlling, for a second one-field period that has N light emitting periods per writing period disposed therein, N being equal to or greater than 2, the light emitting period length of a second particular one of the light emitting periods and the other light emitting period or periods to provide a difference in luminance between the second particular light emitting period and the other light emitting period or periods so that the second particular light emitting period is visually observable, wherein the first particular light emitting period and the second particular light emitting period have different lengths.

12. The display apparatus according to claim 11, wherein the period length from a start timing of the first-time light emitting period to an end timing of the Nth-time light emitting period is at least 80% of a one-field period length.

13. The display apparatus according to claim 11, wherein the period length from a start timing of the first-time light emitting period to an end timing of the Nth-time light emitting period is at least 85% of a one-field period length.

14. A display panel driving apparatus for driving a display panel, comprising:

a display panel driving section configured to control the total light emitting period length within each of a plurality of one-field periods to variably control the peak luminance level of said display panel, said display panel driving section variably controlling, for a first one-field period has N light emitting periods per writing period disposed therein, N being equal to or greater than 2, the light emitting period length of a first particular one of the light emitting periods and the other light emitting period or periods to provide a difference in luminance between the first particular light emitting period and the other light emitting period or periods so that the first particular light emitting period is visually observable, and variably controlling, for a second one-field period that has N light emitting periods per writing period disposed therein, N being equal to or greater than 2, the light emitting period length of a second particular one of the light emitting periods and the other light emitting period or periods to provide a difference in luminance between the second particular light emitting period and the other light emitting period or periods so that the second particular light emitting period is visually observable, wherein the first particular light emitting period and the second particular light emitting period have different lengths.

15. The display panel driving apparatus according to claim 14, wherein the period length from a start timing of the first-time light emitting period to an end timing of the Nth-time light emitting period is at least 80% of a one-field period length.

16. The display panel driving apparatus according to claim 14, wherein the period length from a start timing of the first-time light emitting period to an end timing of the Nth-time light emitting period is at least 85% of a one-field period length.

17. An electronic apparatus, comprising:
 a display panel having a pixel structure configured ready for active matrix driving;
 a display panel driving section configured to control the total light emitting period length within each of a plurality of one-field periods to variably control the peak luminance level of said display panel, said display panel driving section variably controlling, for a first one-field period that has N light emitting periods per writing period disposed therein, N being equal to or greater than 2, the light emitting period length of a first particular one of the light emitting periods and the other light emitting period or periods to provide a difference in luminance between the first particular light emitting period and the other light emitting period or periods so that the first particular light emitting period is visually observable, and variably controlling, for a second one-field period that has N light emitting periods per writing period disposed therein, N being equal to or greater than 2, the light emitting period length of a second particular one of the light emitting periods and the other light emitting period or periods to provide a difference in luminance between the second particular light emitting period and the other light emitting period or periods so that the second particular light emitting period is visually observable, wherein the first particular light emitting period and the second particular light emitting period have different lengths;
 a system control section configured to control said display panel driving section and said display panel.

18. The electronic apparatus according to claim 17, wherein the period length from a start timing of the first-time light emitting period to an end timing of the Nth-time light emitting period is at least 80% of a one-field period length.

19. The electronic apparatus according to claim 17, wherein the period length from a start timing of the first-time light emitting period to an end timing of the Nth-time light emitting period is at least 85% of a one-field period length.

20. A display panel driving method, the method comprising:
 variably controlling, for a first one-field period that has N light emitting periods per writing period disposed therein, N being equal to or greater than 2, a light emitting period length of a first particular light emitting period and rest of light emitting period or periods to provide a difference in luminance between the first particular light emitting period and the rest of emitting period or periods, and
 variably controlling, for a second one-field period that has N light emitting periods per writing period disposed therein, N being equal to or greater than 2, the light emitting period length of a second particular one of the light emitting periods and the rest of light emitting period or periods to provide a difference in luminance between the second particular light emitting period and the rest of light emitting period or periods so that the second particular light emitting period is visually observable, wherein the first particular light emitting period and the second particular light emitting period have different lengths,
 wherein a total light emitting period length is set to more than 50% of the one-field period.

21. The display panel driving method according to claim 20, wherein the total light emitting period length is set to 60% of the one-field period.

22. The display panel driving method according to claim 20, wherein the total light emitting period length is set to vary within a range of 0% to 100% of the one-field period.

23. The display panel driving method according to claim 20, wherein a total light emitting period length is set to vary within a range of 0% to 60% of the one-field period.

* * * * *